(12) United States Patent
Lu et al.

(10) Patent No.: US 11,362,173 B2
(45) Date of Patent: Jun. 14, 2022

(54) CAPACITOR AND MANUFACTURING METHOD THEREFOR

(71) Applicant: SHENZHEN GOODIX TECHNOLOGY CO., LTD., Shenzhen (CN)

(72) Inventors: Bin Lu, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 31 days.

(21) Appl. No.: 17/029,035

(22) Filed: Sep. 23, 2020

(65) Prior Publication Data

US 2021/0036100 A1 Feb. 4, 2021

Related U.S. Application Data

(63) Continuation of application No. PCT/CN2019/099100, filed on Aug. 2, 2019.

(51) Int. Cl.
*H01L 49/02* (2006.01)
*H01L 29/94* (2006.01)
(Continued)

(52) U.S. Cl.
CPC ............. *H01L 28/91* (2013.01); *H01L 28/40* (2013.01); *H01L 28/75* (2013.01); *H01L 28/92* (2013.01);
(Continued)

(58) Field of Classification Search
CPC ......... H01L 28/40; H01L 28/75; H01L 28/91; H01L 29/945; H01L 23/5223;
(Continued)

(56) References Cited

U.S. PATENT DOCUMENTS 8,471,363 B2 6/2013 Asami et al.
8,604,531 B2 12/2013 Tu
(Continued)

FOREIGN PATENT DOCUMENTS

CN 102456750 A 5/2012
CN 102969313 A 3/2013
(Continued)

*Primary Examiner* — Jose R Diaz
(74) *Attorney, Agent, or Firm* — Scully Scott Murphy & Presser

(57) ABSTRACT

Present disclosure provide a capacitor includes: a semiconductor substrate; a laminated structure including n conductive layers and m dielectric layer(s), the i-th conductive layer being provided with at least one i-th isolation trench, the (i+1)-th conductive layer being provided above the i-th conductive layer and in the i-th isolation trench, isolation trenches in odd-numbered and even-numbered conductive layers having a first and a second overlap region in a vertical direction respectively, and the first overlap region not overlapping the second overlap region, where m, n, and i are positive integers, n≥2, and 1≤i≤n−1; at least one first external electrode electrically connected to all odd-numbered conductive layer(s) through a first conductive via structure in the second overlap region; and at least one second external electrode electrically connected to all even-numbered conductive layer(s) through a second conductive via structure in the first overlap region.

20 Claims, 11 Drawing Sheets

(51) Int. Cl.
*H01G 4/30* (2006.01)
*H01L 23/522* (2006.01)

(52) U.S. Cl.
CPC .............. *H01L 29/945* (2013.01); *H01G 4/30* (2013.01); *H01L 23/5223* (2013.01)

(58) Field of Classification Search
CPC .......... H01L 23/481; H01G 4/30; H01G 4/33; H01G 4/232
See application file for complete search history.

(56) References Cited

U.S. PATENT DOCUMENTS

| | | |
|---|---|---|
| 8,937,344 B2 | 1/2015 | Ahn et al. |
| 9,123,736 B2 | 9/2015 | Ahn et al. |
| 9,793,340 B2 | 10/2017 | Voiron et al. |
| 11,043,456 B2 * | 6/2021 | Park .................... H01L 23/5226 |
| 2012/0080772 A1 | 4/2012 | Asami et al. |
| 2012/0091519 A1 | 4/2012 | Tu |
| 2013/0049086 A1 | 2/2013 | Ahn et al. |
| 2015/0093875 A1 | 4/2015 | Ahn et al. |
| 2017/0053979 A1 | 2/2017 | Voiron et al. |

FOREIGN PATENT DOCUMENTS

| | | |
|---|---|---|
| CN | 106170858 A | 11/2016 |
| JP | 2005050805 A | 2/2005 |

\* cited by examiner

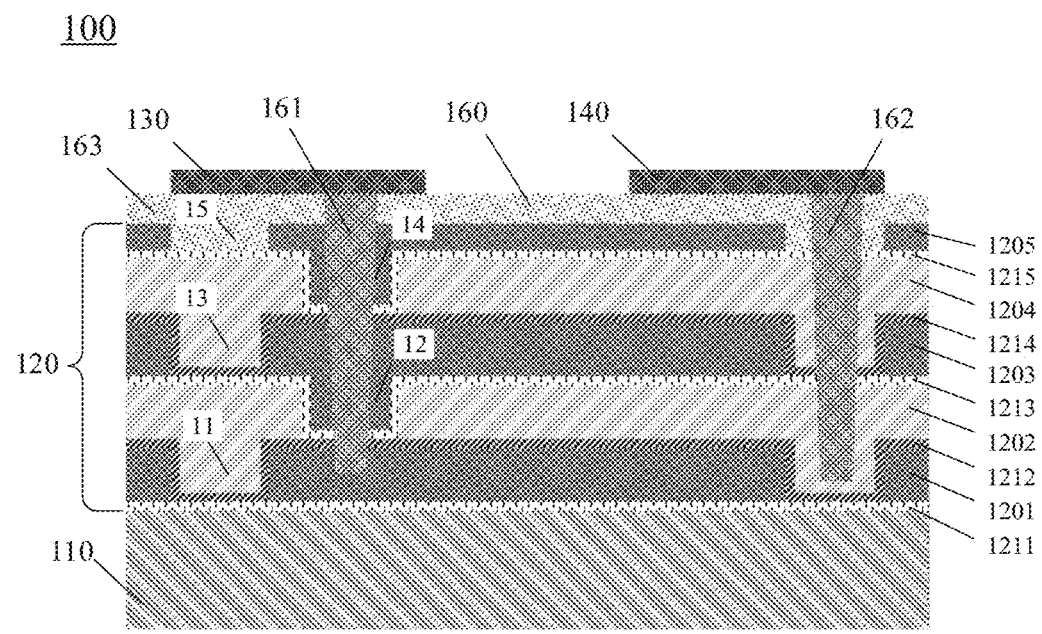
FIG. 1
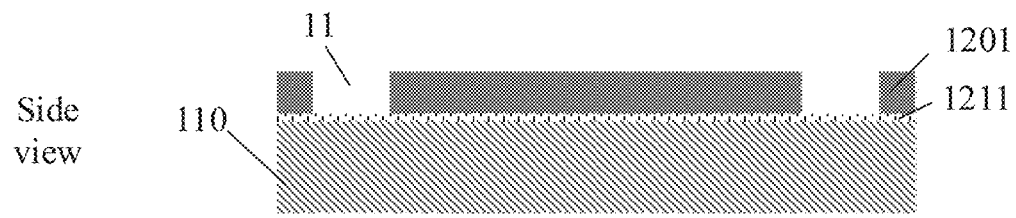
Side view
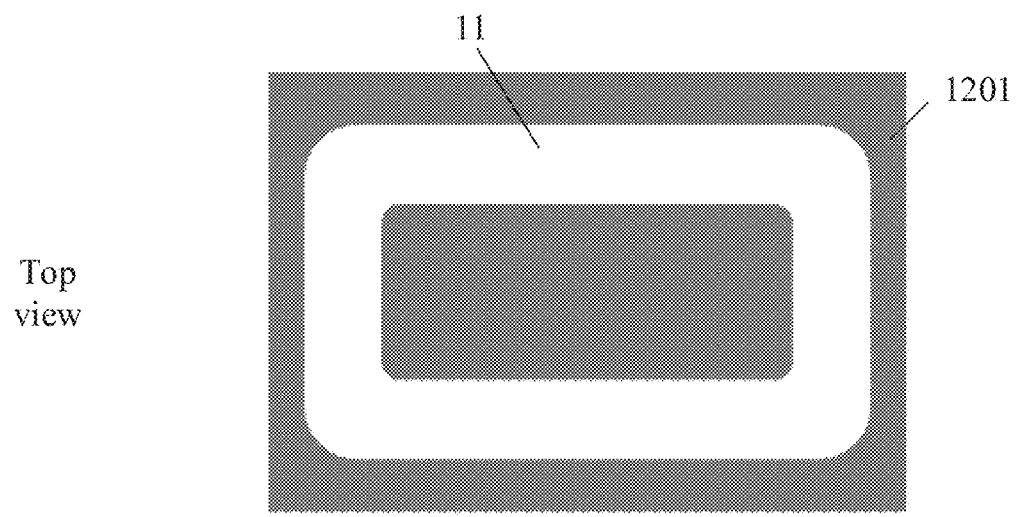
Top view
FIG. 2

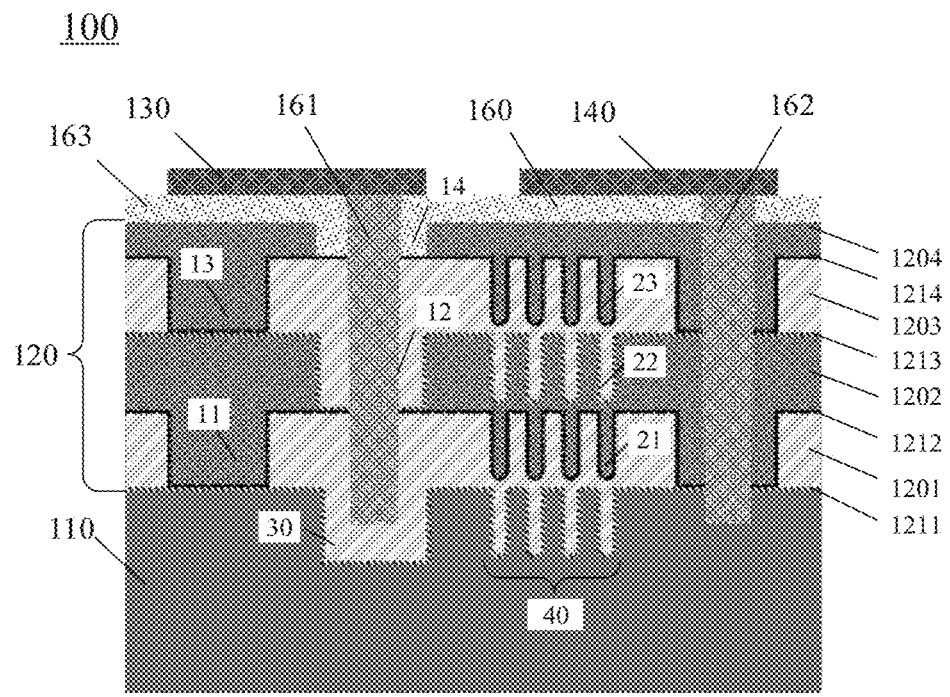

Producing a laminated structure above a semiconductor substrate, where the laminated structure includes n conductive layers and m dielectric layer(s), the n conductive layers and the m dielectric layer(s) form a structure that a conductive layer and a dielectric layer are adjacent to each other, the i-th conductive layer of the n conductive layers is provided with at least one i-th isolation trench, the at least one i-th isolation trench divides the i-th conductive layer into at least two conductive regions electrically isolated from each other, the (i+1)-th conductive layer of the n conductive layers is provided above the i-th conductive layer and in the at least one i-th isolation trench, isolation trenches in odd-numbered conductive layers have a first overlap region in a vertical direction, isolation trenches in even-numbered conductive layers have a second overlap region in the vertical direction, and the first overlap region does not overlap the second overlap region, where m, n, and i are positive integers, n≥2, and 1≤i≤n-1  ~210

Producing at least one first external electrode and at least one second external electrode, where the first external electrode is electrically connected to all odd-numbered conductive layer(s) of the n conductive layers through a first conductive via structure, the second external electrode is electrically connected to all even-numbered conductive layer(s) of the n conductive layers through a second conductive via structure, the first conductive via structure is provided in the second overlap region, and the second conductive via structure is provided in the first overlap region  ~220

FIG. 8

CAPACITOR AND MANUFACTURING METHOD THEREFOR

CROSS-REFERENCE TO RELATED APPLICATIONS

This application is a continuation of International Application No. PCT/CN2019/099100, filed on Aug. 2, 2019, the disclosure of which is hereby incorporated by reference in its entirety.

TECHNICAL FIELD

The present disclosure relates to the field of capacitors, and more particularly, to a capacitor and a manufacturing method therefor.

BACKGROUND

A capacitor can play a role of bypassing, filtering, decoupling, or the like in a circuit, which is an indispensable part for ensuring a normal operation of the circuit. As modern electronic systems continue to develop towards multi-functions, high integration, low power consumption and micro-miniaturization, traditional multi-layer ceramic capacitors (MLCC) are already difficult to meet increasingly stringent needs of a small volume and a high capacity on an application side. How to produce a capacitor with a small volume and a high capacity is a technical problem to be solved urgently.

SUMMARY

Embodiments of the present disclosure provide a capacitor and a manufacturing method therefore, which could produce a capacitor with a small volume and a high capacitance density.

In a first aspect, a capacitor is provided, the capacitor including:

a semiconductor substrate;

a laminated structure provided above the semiconductor substrate and including n conductive layers and m dielectric layer(s), the n conductive layers and the m dielectric layer(s) forming a structure that a conductive layer and a dielectric layer are adjacent to each other, the i-th conductive layer of the n conductive layers being provided with at least one i-th isolation trench, the at least one i-th isolation trench dividing the i-th conductive layer into at least two conductive regions electrically isolated from each other, the (i+1)-th conductive layer of the n conductive layers being provided above the i-th conductive layer and in the at least one i-th isolation trench, isolation trenches in odd-numbered conductive layers having a first overlap region in a vertical direction, isolation trenches in even-numbered conductive layers having a second overlap region in the vertical direction, and the first overlap region not overlapping the second overlap region, where m, n, and i are positive integers, n≥2, and 1≤i≤n−1;

at least one first external electrode, the first external electrode being electrically connected to all odd-numbered conductive layer(s) of the n conductive layers through a first conductive via structure, and the first conductive via structure being provided in the second overlap region; and at least one second external electrode, the second external electrode being electrically connected to all even-numbered conductive layer(s) of the n conductive layers through a second conductive via structure, and the second conductive via structure being provided in the first overlap region.

In some possible implementation manners, the n-th conductive layer of the n conductive layers is provided with at least one n-th isolation trench, and the at least one n-th isolation trench divides the n-th conductive layer into at least two conductive regions electrically isolated from each other.

In some possible implementation manners, numbers and/or sizes of isolation trenches formed on different odd-numbered conductive layers of the n conductive layers are the same; and/or numbers and/or sizes of isolation trenches formed on different even-numbered conductive layers of the n conductive layers are the same.

In some possible implementation manners, isolation trenches formed on different odd-numbered conductive layers of the n conductive layers overlap completely in the vertical direction; and/or isolation trenches formed on different even-numbered conductive layers of the n conductive layers overlap completely in the vertical direction.

In some possible implementation manners, the i-th conductive layer of the n conductive layers is provided with an i-th trench array around the at least one i-th isolation trench, and the (i+1)-th conductive layer of the n conductive layers is provided in the i-th trench array.

In some possible implementation manners, a size of a trench in the i-th trench array is smaller than a size of the at least one i-th isolation trench, and/or a depth of a trench in the i-th trench array is less than a depth of the at least one i-th isolation trench.

In some possible implementation manners, in the n conductive layers, numbers and/or sizes of trenches in trench arrays formed on different conductive layers are the same.

In some possible implementation manners, in the n conductive layers, trench arrays formed on different conductive layers overlap completely in the vertical direction.

In some possible implementation manners, the second external electrode is further electrically connected to the semiconductor substrate through the second conductive via structure.

In some possible implementation manners, the semiconductor substrate is formed of a material with a resistivity less than a threshold value, or a surface of the semiconductor substrate is provided with a heavily doped conductive layer or conductive region with a resistivity less than a threshold value.

In some possible implementation manners, the capacitor further includes: an etching stop structure provided on an upper surface of the semiconductor substrate to prevent the first conductive via structure from being electrically connected with the semiconductor substrate.

In some possible implementation manners, a projection of the etching stop structure on the semiconductor substrate is larger than or equal to the second overlap region.

In some possible implementation manners, the semiconductor substrate includes at least one substrate trench, the at least one substrate trench enters the semiconductor substrate downward from an upper surface of the semiconductor substrate, and the first conductive layer of the n conductive layers is provided in the at least one substrate trench.

In some possible implementation manners, a number of trenches of the at least one substrate trench is the same as a number of isolation trenches provided in an even-numbered conductive layer of the n conductive layers; and/or a size of a trench of the at least one substrate trench is the same as a size of an isolation trench provided in an even-numbered conductive layer of the n conductive layers.

In some possible implementation manners, a projection of the at least one substrate trench on the semiconductor substrate is larger than or equal to the second overlap region.

In some possible implementation manners, the semiconductor substrate further includes a substrate trench array provided around the at least one substrate trench, the substrate trench array enters the semiconductor substrate downward from the upper surface of the semiconductor substrate, and the first conductive layer of the n conductive layers is provided in the substrate trench array.

In some possible implementation manners, a size of a trench in the substrate trench array is smaller than a size of a trench of the at least one substrate trench, and/or a depth of a trench in the substrate trench array is less than a depth of a trench of the at least one substrate trench.

In some possible implementation manners, the capacitor further includes: an electrode layer provided above the laminated structure, the electrode layer includes at least one first conductive region and at least one second conductive region separated from each other, the first conductive region forms the first external electrode, and the second conductive region forms the second external electrode.

In some possible implementation manners, the capacitor further includes: an interconnection structure including at least one insulating layer, the first conductive via structure and the second conductive via structure, the at least one insulating layer is provided above the laminated structure, and the first conductive via structure and the second conductive via structure penetrate the at least one insulating layer.

In some possible implementation manners, the conductive layer includes at least one of:

a heavily doped polysilicon layer, a carbon layer, an aluminum layer, a copper layer, a tungsten layer, a titanium layer, a tantalum layer, a platinum layer, a nickel layer, a ruthenium layer, an iridium layer, a rhodium layer, a tantalum nitride layer, a titanium nitride layer, a titanium aluminum nitride layer, a tantalum silicon nitride layer, or a tantalum carbon nitride layer.

In some possible implementation manners, the dielectric layer includes at least one of:

a silicon oxide layer, a silicon nitride layer, a silicon oxynitride layer, a metal oxide layer, a metal nitride layer, or a metal oxynitride layer.

In a second aspect, a manufacturing method for a capacitor is provided, including:

producing a laminated structure above a semiconductor substrate, where the laminated structure includes n conductive layers and m dielectric layer(s), the n conductive layers and the m dielectric layer(s) form a structure that a conductive layer and a dielectric layer are adjacent to each other, the i-th conductive layer of the n conductive layers is provided with at least one i-th isolation trench, the at least one i-th isolation trench divides the i-th conductive layer into at least two conductive regions electrically isolated from each other, the (i+1)-th conductive layer of the n conductive layers is provided above the i-th conductive layer and in the at least one i-th isolation trench, isolation trenches in odd-numbered conductive layers have a first overlap region in a vertical direction, isolation trenches in even-numbered conductive layers have a second overlap region in the vertical direction, and the first overlap region does not overlap the second overlap region, where m, n, and i are positive integers, $n \geq 2$, and $1 \leq i \leq n-1$; and producing at least one first external electrode and at least one second external electrode, where the first external electrode is electrically connected to all odd-numbered conductive layer(s) of the n conductive layers through a first conductive via structure, the second external electrode is electrically connected to all even-numbered conductive layer(s) of the n conductive layers through a second conductive via structure, the first conductive via structure is provided in the second overlap region, and the second conductive via structure is provided in the first overlap region.

In some possible implementation manners, the n-th conductive layer of the n conductive layers is provided with at least one n-th isolation trench, and the at least one n-th isolation trench divides the n-th conductive layer into at least two conductive regions electrically isolated from each other.

In some possible implementation manners, numbers and/or sizes of isolation trenches formed on different odd-numbered conductive layers of the n conductive layers are the same; and/or numbers and/or sizes of isolation trenches formed on different even-numbered conductive layers of the n conductive layers are the same.

In some possible implementation manners, isolation trenches formed on different odd-numbered conductive layers of the n conductive layers overlap completely in the vertical direction; and/or isolation trenches formed on different even-numbered conductive layers of the n conductive layers overlap completely in the vertical direction.

In some possible implementation manners, the i-th conductive layer of the n conductive layers is provided with an i-th trench array around the at least one i-th isolation trench, and the (i+1)-th conductive layer of the n conductive layers is provided in the i-th trench array.

In some possible implementation manners, a size of a trench in the i-th trench array is smaller than a size of the at least one i-th isolation trench, and/or a depth of a trench in the i-th trench array is less than a depth of the at least one i-th isolation trench.

In some possible implementation manners, in the n conductive layers, numbers and/or sizes of trenches in trench arrays formed on different conductive layers are the same.

In some possible implementation manners, in the n conductive layers, trench arrays formed on different conductive layers overlap completely in the vertical direction.

In some possible implementation manners, the second external electrode is further electrically connected to the semiconductor substrate through the second conductive via structure.

In some possible implementation manners, the semiconductor substrate is formed of a material with a resistivity less than a threshold value, or a surface of the semiconductor substrate is provided with a heavily doped conductive layer or conductive region with a resistivity less than a threshold value.

In some possible implementation manners, the method further includes:

producing an etching stop structure, where the etching stop structure is provided on an upper surface of the semiconductor substrate to prevent the first conductive via structure from being electrically connected with the semiconductor substrate.

In some possible implementation manners, a projection of the etching stop structure on the semiconductor substrate is larger than or equal to the second overlap region.

In some possible implementation manners, the method further includes:

producing at least one substrate trench on the semiconductor substrate, where the at least one substrate trench enters the semiconductor substrate downward from an upper surface of the semiconductor substrate, and the first conductive layer of the n conductive layers is provided in the at least one substrate trench.

In some possible implementation manners, a number of trenches of the at least one substrate trench is the same as a number of isolation trenches provided in an even-numbered conductive layer of the n conductive layers; and/or a size of a trench of the at least one substrate trench is the same as a size of an isolation trench provided in an even-numbered conductive layer of the n conductive layers.

In some possible implementation manners, a projection of the at least one substrate trench on the semiconductor substrate is larger than or equal to the second overlap region.

In some possible implementation manners, the method further includes:

producing a substrate trench array provided around the at least one substrate trench on the semiconductor substrate, where the substrate trench array enters the semiconductor substrate downward from the upper surface of the semiconductor substrate, and the first conductive layer of the n conductive layers is provided in the substrate trench array.

In some possible implementation manners, a size of a trench in the substrate trench array is smaller than a size of a trench of the at least one substrate trench, and/or a depth of a trench in the substrate trench array is less than a depth of a trench of the at least one substrate trench.

In some possible implementation manners, the producing the at least one first external electrode and the at least one second external electrode includes:

producing an electrode layer above the laminated structure, where the electrode layer includes at least one first conductive region and at least one second conductive region separated from each other, the first conductive region forms the first external electrode, and the second conductive region forms the second external electrode.

In some possible implementation manners, the method further includes:

producing an interconnection structure, where the interconnection structure includes at least one insulating layer, the first conductive via structure and the second conductive via structure, the at least one insulating layer is provided above the laminated structure, and the first conductive via structure and the second conductive via structure penetrate the at least one insulating layer.

Therefore, in an embodiment of the present disclosure, a trench capacitor is produced in conductive layers in a laminated structure, and photolithography and thin film deposition steps with a plurality of consistent parameters are repeatedly used, which reduces alignment accuracy requirements of a plurality of conductive layers in the laminated structure, and could increase a number of stacked capacitor layers while maintaining low processing costs, and further increase a capacitance density of the capacitor.

Further, in the embodiment of the present disclosure, there is no need of multiple times of photolithography to form a step structure for electrical connection of an interconnection structure, which could reduce the number of photolithography required for producing the capacitor, reduce the process difficulty, and reduce manufacturing costs of the capacitor.

BRIEF DESCRIPTION OF DRAWINGS

FIG. 1 is a schematic structural diagram of a capacitor provided in the present disclosure.

FIG. 2 is a schematic diagram of a first isolation trench according to an embodiment of the present disclosure.

FIG. 7 is a schematic structural diagram of another semiconductor substrate according to an embodiment of the present disclosure.

FIG. 8 is a schematic flow chart of a manufacturing method for a capacitor according to an embodiment of the present disclosure.

DESCRIPTION OF EMBODIMENTS

Figure 3:
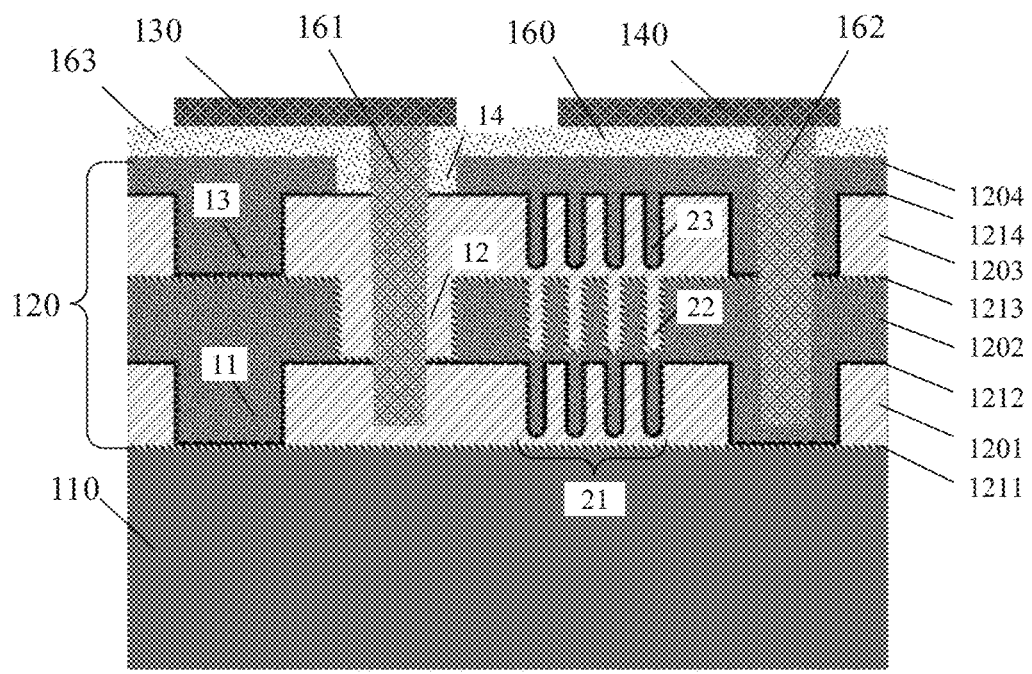
FIG. 3 is a schematic structural diagram of another capacitor according to an embodiment of the present disclosure.

Technical solutions in embodiments of the present disclosure will be described hereinafter with reference to accompanying drawings.

It should be understood that a capacitor of an embodiment of the present disclosure can play a role of bypassing, filtering, decoupling, or the like in a circuit.

The capacitor described in the embodiment of the present disclosure may be a 3D silicon capacitor which is a novel capacitor based on semiconductor wafer processing techniques. Compared with a traditional MLCC, the 3D silicon capacitor has advantages of small size, high precision, strong stability, long lifetime, and the like. In a basic processing flow, a 3D structure with a high aspect ratio, such as a via, a trench, a pillar, or a wall, is required to be first processed on a wafer or substrate, and then an insulating thin film and a low-resistivity conductive material are deposited on a surface of the 3D structure to manufacture a lower electrode, an dielectric layer and an upper electrode of the capacitor, sequentially.

With the help of advanced semiconductor processing processes, it has become possible to manufacture an ultra-thin capacitor with high reliability. To improve a capacitance density, an existing silicon capacitor generally adopts a technical solution of stacking a plurality of layers. Two to three capacitors vertically stacked are manufactured on a surface of a three-dimensional structure, and a plurality of capacitors are then connected in parallel using a metal interconnection structure. However, the entire manufacturing flow of a multi-layer silicon capacitor involves photolithography and deposition steps of multiple steps, and processing costs are therefore relatively expensive.

In this context, the present disclosure proposes a structure and manufacturing method for a novel capacitor, which could increase a number of stacked capacitor layers of while maintaining low processing costs by repeatedly using photolithography and thin film deposition steps with a plurality of consistent parameters, and further increase a capacitance density of the capacitor.

Capacitors according to embodiments of the present disclosure will be introduced in detail hereinafter with reference to FIG. 1 to FIG. 7.

It should be understood that capacitors in FIG. 1 to FIG. 7 are merely examples, a number of conductive layers and a number of dielectric layers included in a laminated structure are merely examples, and the number of conductive layers and the number of dielectric layers included in the laminated structure are not limited to that shown in the capacitors of FIG. 1 to FIG. 7, and may be flexibly set according to actual needs.

It should be noted that, in embodiments shown below, for structures shown in different embodiments, same structures are denoted by same reference numerals for ease of understanding, and detailed description of the same structures is omitted for brevity.

FIG. 1 is a possible structural diagram of a capacitor 100 according to an embodiment of the present disclosure. As shown in FIG. 1, the capacitor 100 includes a semiconductor substrate 110, a laminated structure 120, at least one first external electrode 130, and at least one second external electrode 140.

Specifically, as shown in FIG. 1, in the capacitor 100, the laminated structure 120 is provided above the semiconductor substrate 110, the laminated structure 120 includes n conductive layers and m dielectric layer(s), the n conductive layers and the m dielectric layer(s) form a structure that a conductive layer and a dielectric layer are adjacent to each other, the i-th conductive layer of the n conductive layers is provided with at least one i-th isolation trench, the at least one i-th isolation trench divides the i-th conductive layer into at least two conductive regions electrically isolated from each other, the (i+1)-th conductive layer of the n conductive layers is provided above the i-th conductive layer and in the at least one i-th isolation trench, isolation trenches in odd-numbered conductive layers have a first overlap region in a vertical direction, isolation trenches in even-numbered conductive layers have a second overlap region in the vertical direction, and the first overlap region does not overlap the second overlap region, where m, n, and i are positive integers, n≥2, and 1≤i≤n−1. The first external electrode 130 is electrically connected to all odd-numbered conductive layer(s) of the n conductive layers through a first conductive via structure 161, and the first conductive via structure 161 is provided in the second overlap region. The second external electrode 140 is electrically connected to all even-numbered conductive layer(s) of the n conductive layers through a second conductive via structure 162, and the second conductive via structure 162 is provided in the first overlap region.

Optionally, the n-th conductive layer of the n conductive layers is provided with at least one n-th isolation trench, and the at least one n-th isolation trench divides the n-th conductive layer into at least two conductive regions electrically isolated from each other.

Optionally, in the laminated structure 120, shapes of cross sections of different isolation trenches provided in the same conductive layer may be the same or different.

It should be noted that, in the embodiment of the present disclosure, FIG. 1 is a section along a longitudinal direction of the semiconductor substrate.

In the embodiment of the present disclosure, the isolation trenches in the odd-numbered conductive layers of the n conductive layers have the first overlap region in the vertical direction, the second conductive via structure 162 is provided in the first overlap region, and thus the second external electrode 140 may be electrically connected to all the even-numbered conductive layer(s) of the n conductive layers through the second conductive via structure 162. Similarly, the isolation trenches in the even-numbered conductive layers of the n conductive layers have the second overlap region in the vertical direction, the first conductive via structure 161 is provided in the second overlap region, and thus the first external electrode 130 may be electrically connected to all the odd-numbered conductive layer(s) of the n conductive layers through the first conductive via structure 161. The first overlap region does not overlap the second overlap region, which could prevent occurrence of a short circuit phenomenon between the first external electrode 130 and the second external electrode 140.

In the embodiment of the present disclosure, a trench capacitor is produced in conductive layers in a laminated structure, and photolithography and thin film deposition steps with a plurality of consistent parameters are repeatedly used, which reduces alignment accuracy requirements of a plurality of conductive layers in the laminated structure, and could increase a number of stacked capacitor layers while maintaining low processing costs, and further increase a capacitance density of the capacitor.

Further, in the embodiment of the present disclosure, there is no need of multiple times of photolithography to form a step structure for electrical connection of an interconnection structure, which could reduce the number of photolithography required for producing the capacitor, reduce the process difficulty, and reduce manufacturing costs of the capacitor.

It should be noted that, in the n conductive layers, the isolation trenches in the odd-numbered conductive layers have the first overlap region in the vertical direction, which could also be understood as that projections of the isolation trenches in the odd-numbered conductive layers on the semiconductor substrate 110 have a first overlap region. Similarly, the isolation trenches in the even-numbered conductive layers have the second overlap region in the vertical direction, which could also be understood as that projections of the isolation trenches in the even-numbered conductive layers on the semiconductor substrate 110 have a second overlap region. The first overlap region does not overlap the second overlap region, which could also be understood as that there is no overlap region between the projections of the isolation trenches in the odd-numbered conductive layers on the semiconductor substrate 110 and the projections of the isolation trenches in the even-numbered conductive layers on the semiconductor substrate 110.

Optionally, in the laminated structure 120, an isolation trench provided in a conductive layer may be a trench with a great difference between a length and a width, or a pillar-shaped (Pillar) or a wall-shaped (Wall) 3D structure. Here, a cross section may be understood as a section parallel to a surface of the semiconductor substrate 110, and FIG. 1 is a section along a longitudinal direction of the semiconductor substrate 110.

In the embodiment of the present disclosure, two adjacent conductive layers of the n conductive layers are electrically isolated by a dielectric layer. Moreover, the specific values of m and n may be flexibly configured according to actual needs, as long as electrical isolation between two adjacent conductive layers of the n conductive layers is satisfied.

For example, in a case that the semiconductor substrate 110 does not participate in formation of an electrode plate of the capacitor 100, the first conductive layer in the laminated structure 120 may be directly provided on an upper surface of the semiconductor substrate 110, that is, n=m+1.

For another example, in a case that the semiconductor substrate 110 participates in formation of an electrode plate of the capacitor 100, a dielectric layer needs to be provided between the first conductive layer in the laminated structure 120 and the semiconductor substrate 110 to isolate the first conductive layer from the semiconductor substrate 110, that is, n=m.

It should be understood that, in the embodiment of the present disclosure, an external electrode may also be referred to as a pad or an external pad.

Optionally, in the embodiment of the present disclosure, the semiconductor substrate 110 may be a silicon wafer, including monocrystalline silicon, polysilicon, or amorphous silicon. The semiconductor substrate 110 may also be another semiconductor substrate, including an silicon-on-insulator (SOI) wafer, or a compound semiconductor wafer of a III-V group element, such as silicon carbide (SiC), gallium nitride (GaN), or gallium arsenide (GaAs); or a glass substrate; or an organic polymer substrate; or a substrate with a surface containing an epitaxial layer, an oxide layer, a doped layer, or a bonding layer.

It should be noted that, in the embodiment of the present disclosure, a thickness of the semiconductor substrate 110 may also be flexibly set according to actual needs. For example, when the thickness of the semiconductor substrate 110 is too thick to meet needs, thinning processing may be performed on the semiconductor substrate 110.

Optionally, materials of the first external electrode 130 and the second external electrode 140 may be metal, such as copper or aluminum. The first external electrode 130 and the second external electrode 140 may further contain a low-resistivity Ti, TiN, Ta, or TaN layer as an adhesion layer and/or a barrier layer, or may contain some metal layers located on surfaces of the external electrodes, such as Ni, Pd (palladium), Au, Sn (tin), or Ag, for subsequent wire bonding or welding processes.

Optionally, in the embodiment of the present disclosure, the conductive layer includes at least one of:

a heavily doped polysilicon layer, a carbon layer, an aluminum layer, a copper layer, a tungsten layer, a titanium layer, a tantalum layer, a platinum layer, a nickel layer, a ruthenium layer, an iridium layer, a rhodium layer, a tantalum nitride layer, a titanium nitride layer, a titanium aluminum nitride layer, a tantalum silicon nitride layer, or a tantalum carbon nitride layer.

That is, a material of the conductive layer in the laminated structure 120 may be heavily doped polysilicon, carbon, metal, such as aluminum (Al), tungsten (W), copper (Cu), titanium (Ti), tantalum (Ta), platinum (Pt), ruthenium (Ru), iridium (Ir), rhodium (Rh) or nickel (Ni), a low-resistivity compound, such as tantalum nitride (TaN), titanium nitride (TiN), titanium aluminum nitride (TiAlN), tantalum silicon nitride (TaSiN) or tantalum carbon nitride (TaCN), or a combination or laminated structure of the above materials. The specific conductive material and layer thickness may be adjusted according to needs of the capacitor, such as a capacitance value, a frequency characteristic, or the loss. Certainly, the conductive layer in the laminated structure 120 may further include some other conductive materials, which is not limited in the embodiment of the present disclosure.

Optionally, in the embodiment of the present disclosure, the dielectric layer includes at least one of:

a silicon oxide layer, a silicon nitride layer, a silicon oxynitride layer, a metal oxide layer, a metal nitride layer, or a metal oxynitride layer.

That is, a material of the dielectric layer in the laminated structure 120 may be a silicon oxide, a silicon nitride, a silicon oxynitride, a metal oxide, a metal nitride, or a metal oxynitride, such as $SiO_2$, SiN, SiON, or a high dielectric constant (high-k) material, including $Al_2O_3$, $HfO_2$, $ZrO_2$, $TiO_2$, $Y_2O_3$, $La_2O_3$, $HfSiO_4$, $LaAlO_3$, $SrTiO_3$, $LaLuO_3$, or the like. The dielectric layer in the laminated structure 120 may be one layer or contain a plurality of laminated layers, and may be one material or a combination or mixture of a plurality of materials. The specific insulating material and layer thickness may be adjusted according to needs of the capacitor, such as a capacitance value, a frequency characteristic, or the loss. Certainly, the dielectric layer in the laminated structure 120 may further include some other insulating materials, which is not limited in the embodiment of the present disclosure.

It should be noted that, in the laminated structure 120, an order of the m dielectric layer(s) is: an ascending order of distances to the semiconductor substrate 110 on the semiconductor substrate 110. Similarly, an order of the n conductive layers is: an ascending order of distances to the semiconductor substrate 110 on the semiconductor substrate 110.

It should be noted that the first external electrode 130 is electrically connected to all the odd-numbered conductive layer(s) of the n conductive layers through the first conductive via structure 161, and the second external electrode 140 is electrically connected to all the even-numbered conductive layer(s) of the n conductive layers through the second conductive via structure 162, thereby avoiding that a plurality of step structures are formed by multiple times of photolithography, and the first external electrode 130 and the second external electrode 140 are respectively electrically connected to the conductive layers through the plurality of step structures, which reduces the number of photolithography steps and reduces the costs for producing the capacitor.

Further, the first external electrode 130 is electrically connected to all the odd-numbered conductive layer(s) of the n conductive layers, the second external electrode 140 is electrically connected to all the even-numbered conductive layer(s) of the n conductive layers, and thus an effect of increasing a capacitance density of the capacitor by the laminated structure could be fully exerted.

As an example, it is assumed that the capacitor 100 includes a laminated structure, which is denoted as a laminated structure 1, and includes two first external electrodes and two second external electrodes. The two first external electrodes are respectively denoted as a first external electrode A and a first external electrode B, and the two second external electrodes are respectively denoted as a second external electrode C and a second external electrode D. The laminated structure 1 includes five conductive layers and four dielectric layers. The five conductive layers are respectively denoted as a conductive layer 1, a conductive layer 2, a conductive layer 3, a conductive layer 4 and a conductive layer 5, and the four dielectric layers are respectively denoted as a dielectric layer 1, a dielectric layer 2, a dielectric layer 3 and a dielectric layer 4.

Specifically, the first external electrode A is electrically connected to the conductive layer 1, the conductive layer 3 and the conductive layer 5, and the first external electrode B is also electrically connected to the conductive layer 1, the conductive layer 3 and the conductive layer 5. The second external electrode C is electrically connected to the conductive layer 2 and the conductive layer 4, and second external electrode D is also electrically connected to the conductive layer 2 and the conductive layer 4. For capacitors corresponding to the first external electrode A and the second external electrode C, the conductive layer 1 and the conductive layer 2 form a capacitor 1, whose capacitance value is denoted as C1, the conductive layer 2 and the conductive layer 3 form a capacitor 2, whose capacitance value is denoted as C2, the conductive layer 3 and the conductive layer 4 form a capacitor 3, whose capacitance value is denoted as C3, and the conductive layer 4 and the conductive layer 5 form a capacitor 4, whose capacitance value is denoted as C4. The capacitor 1, the capacitor 2, the capacitor 3 and the capacitor 4 are connected in parallel, and a capacitance value of an equivalent capacitor i is denoted as Ci, then Ci=C1+C2+C3+C4. For capacitors corresponding to the first external electrode B and the second external electrode D, the conductive layer 1 and the conductive layer 2 form a capacitor 1, whose capacitance value is denoted as C1, the conductive layer 2 and the conductive layer 3 form a capacitor 2, whose capacitance value is denoted as C2, the conductive layer 3 and the conductive layer 4 form a capacitor 3, whose capacitance value is denoted as C3, and the conductive layer 4 and the conductive layer 5 form a capacitor 4, whose capacitance value is denoted as C4. The capacitor 1, the capacitor 2, the capacitor 3 and the capacitor 4 are connected in parallel, and a capacitance value of an equivalent capacitor j is denoted as Cj, then Cj=C1+C2+C3+C4. Certainly, for capacitors corresponding to the first external electrode A and the second external electrode D, a similar series-parallel structure may be formed. For capacitors corresponding to the first external electrode B and the second external electrode C, a similar series-parallel structure may be formed. No further details are repeated redundantly herein.

In the embodiment of the present disclosure, the laminated structure 120 is produced by repeatedly using photolithography and thin film deposition steps with a plurality of consistent parameters. For example, the same etching parameters are adopted for all the odd-numbered conductive layer(s) in the laminated structure 120, and the same etching parameters are adopted for all the even-numbered conductive layer(s) in the laminated structure 120, thereby reducing alignment accuracy requirements of a plurality of conductive layers in the laminated structure 120.

Optionally, in the embodiment of the present disclosure, numbers and/or sizes of isolation trenches formed on different odd-numbered conductive layers of the n conductive layers are the same; and/or numbers and/or sizes of isolation trenches formed on different even-numbered conductive layers of the n conductive layers are the same.

For example, in all the odd-numbered conductive layers of the n conductive layers, projection positions and/or projection areas of isolation trenches provided on different conductive layers on the semiconductor substrate 110 are the same; and/or in all the odd-numbered conductive layers of the n conductive layers, numbers and/or sizes of isolation trenches provided on different conductive layers are the same.

Optionally, in the embodiment of the present disclosure, isolation trenches formed on different odd-numbered conductive layers of the n conductive layers overlap completely in the vertical direction; and/or isolation trenches formed on different even-numbered conductive layers of the n conductive layers overlap completely in the vertical direction.

For example, in all the even-numbered conductive layers of the n conductive layers, projection positions and/or projection areas of isolation trenches provided on different conductive layers on the semiconductor substrate 110 are the same; and/or in all the even-numbered conductive layers of the n conductive layers, numbers and/or sizes of isolation trenches provided on different conductive layers are the same.

Optionally, in all the odd-numbered conductive layers of the n conductive layers, isolation trenches provided on different conductive layers overlap completely in the vertical direction; and/or; and/or in all the even-numbered conductive layers of the n conductive layers, isolation trenches provided on different conductive layers overlap completely in the vertical direction.

Optionally, in the n conductive layers, a number of trenches provided on an odd-numbered conductive layer may be the same as or different from a number of trenches provided on an even-numbered conductive layer.

For example, as shown in FIG. 1, in the n conductive layers, a number of trenches provided on an odd-numbered conductive layer is equal to a number of trenches provided on an even-numbered conductive layer.

Optionally, in one embodiment of the present disclosure, n=5, and m=5, that is, the laminated structure 120 may include five conductive layers, such as the first conductive layer 1201, the second conductive layer 1202, the third conductive layer 1203, the fourth conductive layer 1204 and the fifth conductive layer 1205 shown in FIG. 1, and five dielectric layers, such as the first dielectric layer 1211, the second dielectric layer 1212, the third dielectric layer 1213, the fourth dielectric layer 1214 and the fifth dielectric layer 1215 shown in FIG. 1. The first dielectric layer 1211 is provided between the semiconductor substrate 110 and the first conductive layer 1201, the second dielectric layer 1212 is provided between the first conductive layer 1201 and the second conductive layer 1202, the third dielectric layer 1312 is provided between the second conductive layer 1202 and the third conductive layer 1203, the fourth dielectric layer 1214 is provided between the third conductive layer 1203 and the fourth conductive layer 1204, and the fifth dielectric layer 1215 is provided between the fourth conductive layer 1204 and the fifth conductive layer 1205. Specifically, as shown in FIG. 1, the first conductive layer 1201 is provided with a first isolation trench 11, the second conductive layer 1202 is provided with a second isolation trench 12, the third conductive layer 1203 is provided with a third isolation trench 13, the fourth conductive layer 1204 is provided with a fourth isolation trench 14, and the fifth conductive layer 1205 is provided with a fifth isolation trench 15. The first isolation trench 11, the third isolation trench 13 and the fifth isolation trench 15 overlap completely in the vertical direction, and numbers and/or sizes of isolation trenches formed on the first conductive layer 1201, the third conductive layer 1203 and the fifth conductive layer 1205 are the same. Similarly, the second isolation trench 12 and the fourth isolation trench 14 overlap completely in the vertical direction, and numbers and/or sizes of isolation trenches formed on the second conductive layer 1202 and the fourth conductive layer 1204 are the same. As shown in FIG. 1, the isolation trenches provided in the odd-numbered conductive layers and the isolation trenches provided on the even-numbered conductive layers are misalignedly arranged. That is, isolation trenches in odd-numbered conductive layers have a first overlap region in the vertical direction, isolation trenches in even-numbered conductive layers have a second overlap region in the vertical direction, and the first overlap region does not overlap the second overlap region.

It should be noted that a side view and a top view of the first isolation trench 11 may be as shown in FIG. 2, and the third isolation trench 13 and the fifth isolation trench 15 are similar to the first isolation trench 11.

Optionally, in the embodiment of the present disclosure, the i-th conductive layer of the n conductive layers is provided with an i-th trench array around an i-th isolation trench, and the (i+1)-th conductive layer of the n conductive layers is provided in the i-th trench array.

Optionally, a size of a trench in the i-th trench array is smaller than a size of the i-th isolation trench, and/or a depth of a trench in the i-th trench array is less than a depth of the i-th isolation trench.

For example, a size of a trench in the i-th trench array may be 1 μm, and a size of the i-th isolation trench may be 5 μm, which is not limited in the present disclosure.

Optionally, in the n conductive layers, projection positions and/or projection areas of trench arrays provided on different conductive layers on the semiconductor substrate 110 are the same.

Optionally, in the n conductive layers, numbers and/or sizes of trenches in trench arrays provided on different conductive layers are the same.

Optionally, in the n conductive layers, trench arrays formed on different conductive layers overlap completely in the vertical direction.

It should be noted that a depth and width of a trench in a trench array provided in the n conductive layers may be flexibly set according to actual needs. Preferably, the trench in the trench array provided in the n conductive layers has a high aspect ratio. A trench array and an isolation trench provided in the same conductive layer may be formed in the same etching step.

It should be noted that trench arrays are provided in the n conductive layers, which could further increase a capacitance value of a capacitor formed in the laminated structure 120.

Optionally, in one embodiment of the present disclosure, n=4, and m=4, that is, the laminated structure 120 may include four conductive layers, such as the first conductive layer 1201, the second conductive layer 1202, the third conductive layer 1203 and the fourth conductive layer 1204 shown in FIG. 3, and four dielectric layers, such as the first dielectric layer 1211, the second dielectric layer 1212, the third dielectric layer 1213 and the fourth dielectric layer 1214 shown in FIG. 3. The first dielectric layer 1211 is provided between the semiconductor substrate 110 and the first conductive layer 1201, the second dielectric layer 1212 is provided between the first conductive layer 1201 and the second conductive layer 1202, the third dielectric layer 1312 is provided between the second conductive layer 1202 and the third conductive layer 1203, and the fourth dielectric layer 1214 is provided between the third conductive layer 1203 and the fourth conductive layer 1204. Specifically, as shown in FIG. 3, the first conductive layer 1201 is provided with a first isolation trench 11 and a first trench array 21, the second conductive layer 1202 is provided with a second isolation trench 12 and a second trench array 22, the third conductive layer 1203 is provided with a third isolation trench 13 and a third trench array 23, and the fourth conductive layer 1204 is provided with only a fourth isolation trench 14. As shown in FIG. 3, a size of a trench in the first trench array 21 is smaller than a size of the first isolation trench 11, and a depth of a trench in the first trench array 21 is less than a depth of the first isolation trench 11. A size of a trench in the second trench array 22 is smaller than a size of the second isolation trench 12, and a depth of a trench in the second trench array 22 is less than a depth of the second isolation trench 12. A size of a trench in the third trench array 23 is smaller than a size of the third isolation trench 13, and a depth of a trench in the third trench array 23 is less than a depth of the third isolation trench 13. As shown in FIG. 3, projection positions and/or projection areas of the first trench array 21, the second trench array 22 and the third trench array 23 on the semiconductor substrate 110 are the same. Numbers and/or sizes of trenches in the first trench array 21, the second trench array 22 and the third trench array 23 are the same. Trench arrays formed on different conductive layers may overlap completely in the vertical direction.

It should be noted that a side view and a top view of the first isolation trench 11 may be as shown in FIG. 2, and the third isolation trench 13 is similar to the first isolation trench 11.

Optionally, in the embodiment of the present disclosure, the semiconductor substrate 110 is made of a material with a resistivity less than a threshold value, or a surface of the semiconductor substrate 110 is provided with a heavily doped conductive layer or conductive region with a resistivity less than a threshold value. That is, the semiconductor substrate 110 is conductive, or a region of the semiconductor substrate 110 in contact with the laminated structure 120 is conductive.

It should be noted that the material with a resistivity less than a threshold value may be considered as a conductive material.

For example, the semiconductor substrate 110 is a heavily doped substrate.

For another example, the semiconductor substrate 110 may be doped to form a p++-type or n++-type low-resistivity conductive layer or conductive region.

For yet another example, a low-resistivity conductive material is deposited on the surface of the semiconductor substrate 110. For example, metal, such as TiN and/or TaN and/or Pt, is deposited using a PVD or ALD process, or heavily doped polysilicon, a metal of tungsten or a carbon material is deposited using a CVD process.

It should be noted that, if the semiconductor substrate 110 is formed of a material with a resistivity less than a threshold value, it can be considered that the semiconductor substrate 110 is a heavily doped low-resistivity substrate; if the surface of the semiconductor substrate 110 is provided with a heavily doped conductive layer with a resistivity less than a threshold value, it can be considered that the surface of the semiconductor substrate 110 is provided with a heavily doped low-resistivity conductive layer; and if the surface of the semiconductor substrate 110 is provided with a heavily doped conductive region with a resistivity less than a threshold value, it can be considered that the surface of the semiconductor substrate 110 is provided with a heavily doped low-resistivity conductive region.

Optionally, in the embodiment of the present disclosure, the second external electrode 140 is further electrically connected to the semiconductor substrate 110 through the second conductive via structure 162.

Figure 4:
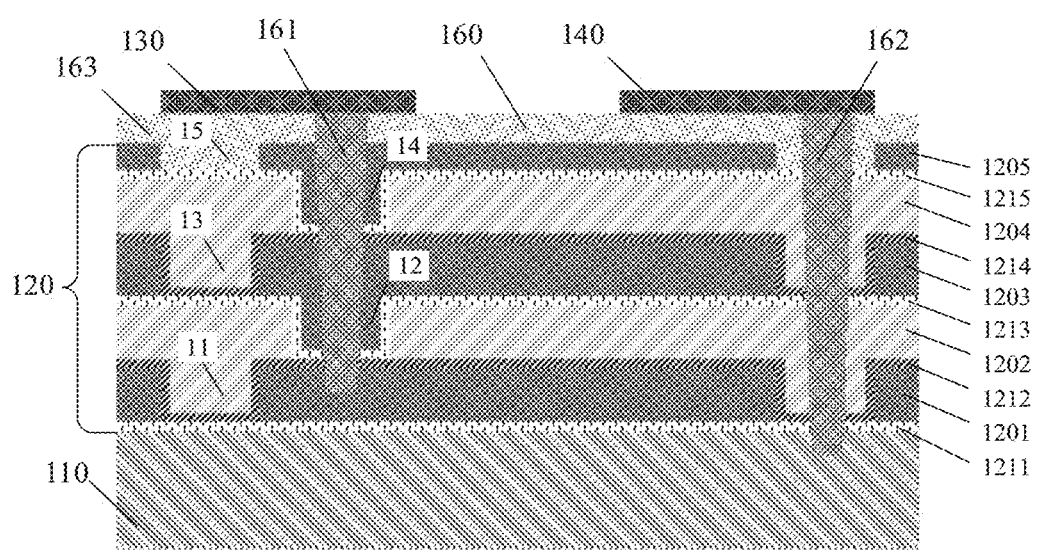
FIG. 4 is a schematic structural diagram of yet another capacitor according to an embodiment of the present disclosure.

For example, as shown in FIG. 4, the second conductive via structure 162 extends into the semiconductor substrate 110 after penetrating isolation trenches in odd-numbered conductive layer(s) of the n conductive layers. The second external electrode 140 is electrically connected to the semiconductor substrate 110 and all even-numbered conductive layers of the n conductive layers through the second conductive via structure 162. The first conductive via structure 161 extends into the first conductive layer in the laminated structure 120 after penetrating isolation trenches in even-numbered conductive layers of the n conductive layers.

It should be understood that settings of FIG. 4 are the same as those of FIG. 1 except that the setting of the second conductive via structure 162 is different. No further details are repeated redundantly for brevity.

Figure 5:
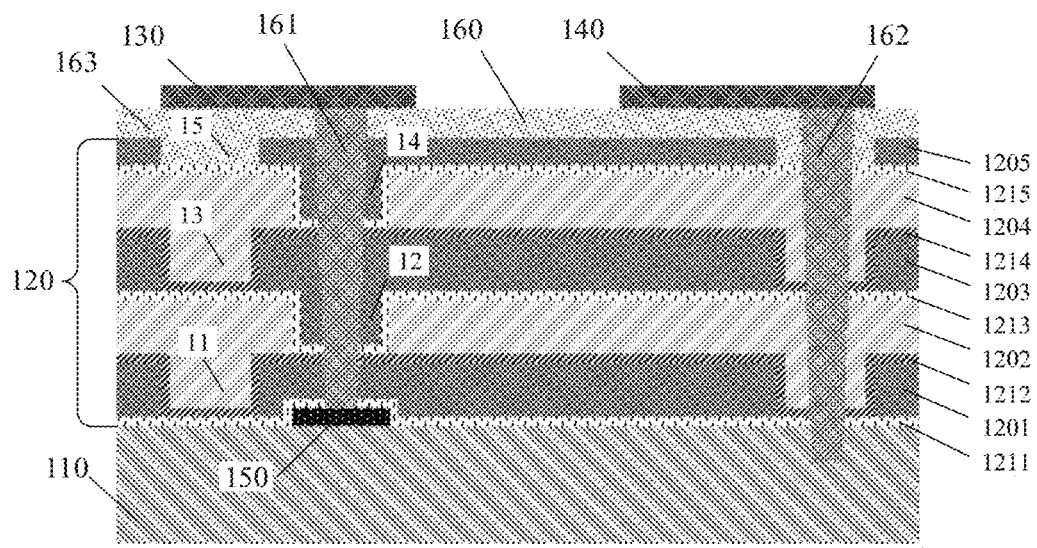
FIG. 5 is a schematic structural diagram of yet another capacitor according to an embodiment of the present disclosure.

Optionally, in the embodiment of the present disclosure, the capacitor 100 further includes an etching stop structure 150, the etching stop structure 150 is provided on an upper surface of the semiconductor substrate 110 to prevent the first conductive via structure 161 from being electrically connected with the semiconductor substrate 110. Specifically, as shown in FIG. 5, the first conductive via structure 161 extends to an upper surface of the etching stop structure 150 after penetrating the laminated structure 120.

It should be noted that, in a case that the first conductive via structure 161 and the second conductive via structure 162 are formed in the same etching step, the etching stop structure 150 could effectively prevent the first conductive via structure 161 from being electrically connected with the semiconductor substrate 110.

Optionally, a projection of the etching stop structure 150 on the semiconductor substrate 110 is larger than or equal to the second overlap region to ensure that the etching stop structure 150 could prevent the first conductive via structure 161 from being electrically connected with the semiconductor substrate 110.

It should be understood that the etching stop structure 150 is more resistant to etching than the conductive layer and the dielectric layer in the laminated structure 120. When the first conductive via structure 161 is obtained by etching, a bottom of the first conductive via structure 161 may stay on the etching stop structure 150.

Optionally, the etching stop structure 150 may be silicon oxide, silicon nitride, or silicon-containing glass (undoped silicon glass (USG), boro-silicate glass (BSG), phospho-silicate glass (PSG), or boro-phospho-silicate glass (BPSG)) deposited by a chemical vapor deposition (CVD) process; or aluminum oxide deposited by atomic layer deposition (ALD); or sprayed or spin-coated spin on glass (Spin on glass, SOG), polyimide, or the like; or a combination of the above materials.

It should be understood that settings of FIG. 5 are the same as those of FIG. 4 except that the settings of the first conductive via structure 161 and the etching stop structure 150 are different. No further details are repeated redundantly for brevity.

Figure 6:
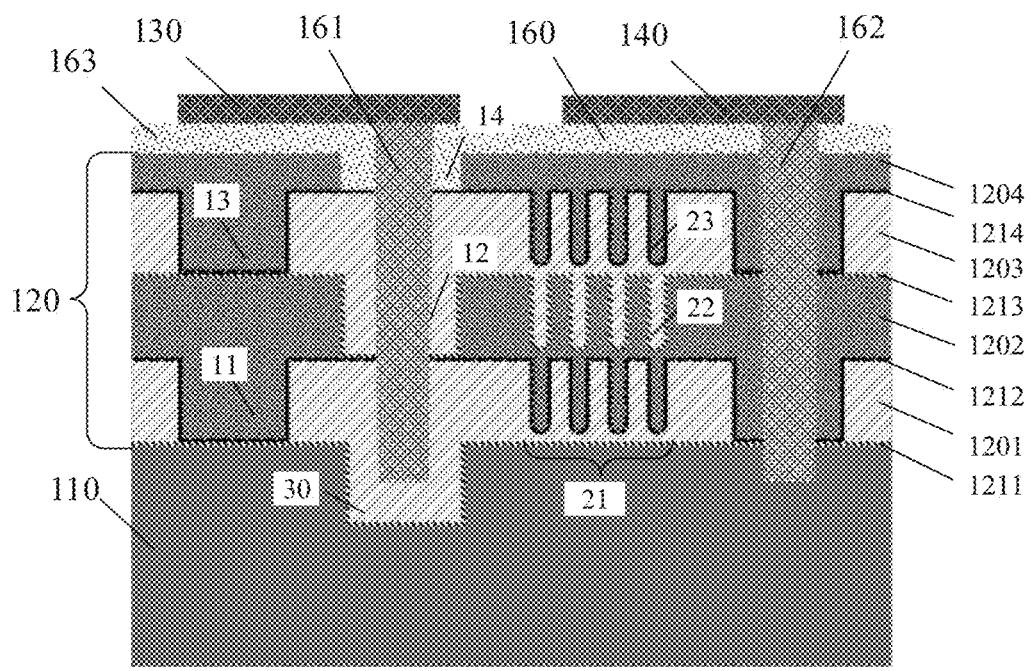
FIG. 6 is a schematic structural diagram of a semiconductor substrate according to an embodiment of the present disclosure.

Optionally, in the embodiment of the present disclosure, as shown in FIG. 6, the semiconductor substrate 110 includes at least one substrate trench 30, the at least one substrate trench 30 enters the semiconductor substrate 110 downward from an upper surface of the semiconductor substrate 110, and the first conductive layer of the n conductive layers is provided in the at least one substrate trench.

Optionally, a number of trenches of the at least one substrate trench 30 is the same as a number of isolation trenches provided in an even-numbered conductive layer of the n conductive layers; and/or a size of a trench of the at least one substrate trench 30 is the same as a size of an isolation trench provided in an even-numbered conductive layer of the n conductive layers.

Optionally, a projection of the at least one substrate trench 30 on the semiconductor substrate 110 is larger than or equal to the second overlap region.

It should be understood that settings of FIG. 6 are the same as those of FIG. 3 except that the at least one substrate trench 30 is not provided. No further details are repeated redundantly for brevity.

Optionally, as shown in FIG. 7, the semiconductor substrate 110 further includes a substrate trench array provided around the at least one substrate trench, the substrate trench array enters the semiconductor substrate 110 downward from the upper surface of the semiconductor substrate 110, and the first conductive layer of the n conductive layers is provided in the substrate trench array.

Optionally, a size of a trench in the substrate trench array 40 is smaller than a size of a trench of the at least one substrate trench 30, and/or a depth of a trench in the substrate trench array 40 is less than a depth of a trench of the at least one substrate trench 30.

It should be understood that settings of FIG. 7 are the same as those of FIG. 6 except that the substrate trench array 40 is not provided. No further details are repeated redundantly for brevity.

Optionally, in the embodiment of the present disclosure, the capacitor 100 further includes an interconnection structure 160, where the interconnection structure 160 includes at least one insulating layer 163, the first conductive via structure 161 and the second conductive via structure 162. As shown in FIG. 1 to FIG. 7, the at least one insulating layer 163 is provided above the laminated structure 120, and the first conductive via structure 161 and the second conductive via structure 162 penetrate the at least one insulating layer 163.

It should be noted that the at least one insulating layer 163 may also be referred to as an intermetal dielectric layer (IMD) or an interlay dielectric layer (ILD). The first conductive via structure 161 and the second conductive via structure 162 may also be referred to as conductive channels.

Optionally, the at least one insulating layer 163 covers the laminated structure 120, and the at least one insulating layer 163 may fill a cavity or gap formed on an upper surface of the laminated structure 120 to improve structural integrity and mechanical stability of the capacitor.

Optionally, a material of the at least one insulating layer 163 may be an organic polymer material, including polyimide, parylene, benzocyclobutene (BCB), or the like; or some inorganic materials, including spin on glass (SOG), undoped silicon glass (USG), boro-silicate glass (BSG), phospho-silicate glass (PSG), boro-phospho-silicate glass (BPSG), a silicon oxide synthesized from tetraethyl orthosilicate (TEOS), a silicon oxide or nitride, or ceramic; or a combination or laminated layer of the above materials.

Optionally, materials of the first conductive via structure 161 and the second conductive via structure 162 may be made up of a low-resistivity conductive material, such as heavily doped polysilicon, tungsten, Ti, TiN, Ta, or TaN.

It should be understood that shapes and numbers of the first conductive via structure 161 and the second via structure 162 may be specifically determined according to manufacturing processes of the capacitor 100, which is not limited in the embodiment of the present disclosure.

Optionally, in some embodiments, the at least one first external electrode 130 and the at least one second external electrode 140 are provided above the laminated structure 120. Optionally, the capacitor 100 further includes an electrode layer provided above the laminated structure 120, the electrode layer includes at least one first conductive region and at least one second conductive region separated from each other, the first conductive region forms the first external electrode 130, and the second conductive region forms the second external electrode 140, as shown in FIG. 1 to FIG. 7. That is, the at least one first external electrode 130 and the at least one second external electrode 140 may be formed by etching once, which reduces the number of etching steps.

Specifically, as shown FIG. 1 to FIG. 7, the electrode layer is provided above the interconnection structure 160, the first external electrode 130 is electrically connected to an odd-numbered conductive layer(s) in the laminated structure 120 through the first conductive via structure 161, and the second external electrode 140 is electrically connected to an even-numbered conductive layer(s) in the laminated structure 120 through the second conductive via structure 162.

In the embodiment of the present disclosure, a trench capacitor is manufactured separately in a semiconductor substrate and a conductive layer, and a process of manufacturing a single capacitor may be repeatedly used, which reduces alignment accuracy requirements of a plurality of conductive layers, and could further improve a capacitance density of the capacitor without increasing the process difficulty.

The capacitors according to the embodiments of the present disclosure are described above, and a method for producing a capacitor according to an embodiment of the present disclosure will be described below. The method for producing a capacitor according to the embodiment of the present disclosure may produce the capacitors according to the foregoing embodiments of the present disclosure, and relevant descriptions in the following embodiment and the foregoing embodiments may refer to each other.

A manufacturing method for a capacitor according to an embodiment of the present disclosure will be introduced in detail hereinafter with reference to FIG. 8.

It should be understood that FIG. 8 is a schematic flow chart of a manufacturing method for a capacitor according to an embodiment of the present disclosure, but these steps or operations are merely examples, and other operations or variations of each operation in FIG. 8 may also be performed in the embodiment of the present disclosure.

FIG. 8 illustrates a schematic flow chart of a manufacturing method 200 for a capacitor according to an embodiment of the present disclosure. As shown in FIG. 8, the manufacturing method 200 for a capacitor includes:

step 210, producing a laminated structure above a semiconductor substrate, where the laminated structure includes n conductive layers and m dielectric layer(s), the n conductive layers and the m dielectric layer(s) form a structure that a conductive layer and a dielectric layer are adjacent to each other, the i-th conductive layer of the n conductive layers is provided with at least one i-th isolation trench, the at least one i-th isolation trench divides the i-th conductive layer into at least two conductive regions electrically isolated from each other, the (i+1)-th conductive layer of the n conductive layers is provided above the i-th conductive layer and in the at least one i-th isolation trench, isolation trenches in odd-numbered conductive layers have a first overlap region in a vertical direction, isolation trenches in even-numbered conductive layers have a second overlap region in the vertical direction, and the first overlap region does not overlap the second overlap region, where m, n, and i are positive integers, n≥2, and 1≤i≤n−1; and step 220, producing at least one first external electrode and at least one second external electrode, where the first external electrode is electrically connected to all odd-numbered conductive layer(s) of the n conductive layers through a first conductive via structure, the second external electrode is electrically connected to all even-numbered conductive layer(s) of the n conductive layers through a second conductive via structure, the first conductive via structure is provided in the second overlap region, and the second conductive via structure is provided in the first overlap region.

Optionally, the n-th conductive layer of the n conductive layers is provided with at least one n-th isolation trench, and the at least one n-th isolation trench divides the n-th conductive layer into at least two conductive regions electrically isolated from each other.

Specifically, the capacitors as shown in FIG. 1 to FIG. 7 may be produced based on the above steps 210 to 220.

It should be understood that an upper surface of each material layer described in steps 210 to 220 refers to a surface of the material layer substantially parallel to an upper surface of the semiconductor substrate, and an inner surface of each material layer refers to an upper surface of the material layer located in a trench. The upper surface and the inner surface may be regarded as a whole.

Optionally, numbers and/or sizes of isolation trenches formed on different odd-numbered conductive layers of the n conductive layers are the same; and/or numbers and/or sizes of isolation trenches formed on different even-numbered conductive layers of the n conductive layers are the same.

For example, in all the odd-numbered conductive layers of the n conductive layers, numbers and/or sizes of isolation trenches formed on different conductive layers are the same; and/or in all the even-numbered conductive layers of the n conductive layers, numbers and/or sizes of isolation trenches formed on different conductive layers are the same.

Optionally, isolation trenches formed on different odd-numbered conductive layers of the n conductive layers overlap completely in the vertical direction; and/or isolation trenches formed on different even-numbered conductive layers of the n conductive layers overlap completely in the vertical direction.

For example, in all the odd-numbered conductive layers of the n conductive layers, isolation trenches formed on different conductive layers overlap completely in the vertical direction; and/or; and/or in all the even-numbered conductive layers of the n conductive layers, isolation trenches formed on different conductive layers overlap completely in the vertical direction.

That is, the same photolithography and deposition processes may be adopted for all the odd-numbered conductive layer(s) of the n conductive layers, the same photolithography and deposition processes may be adopted for all the even-numbered conductive layer(s) of the n conductive layers, and thus the process complexity and processing costs could be reduced.

Optionally, the i-th conductive layer of the n conductive layers is provided with an i-th trench array around an i-th isolation trench, and the (i+1)-th conductive layer of the n conductive layers is provided in the i-th trench array. That is, the n-th conductive layer of the n conductive layers is not provided with a trench array.

Optionally, a size of a trench in the i-th trench array is smaller than a size of the i-th isolation trench, and/or a depth of a trench in the i-th trench array is less than a depth of the i-th isolation trench.

For example, a size of a trench in the i-th trench array may be 1 μm, and a size of the i-th isolation trench may be 5 μm, which is not limited in the present disclosure.

It should be noted that since the size of the i-th isolation trench is large, when the i-th isolation trench and the i-th trench array are formed simultaneously in the same etching step, the depth of the i-th isolation trench is deeper than that of the i-th trench array. That is, the i-th trench array does not penetrate the i-th conductive layer.

Optionally, in the n conductive layers, numbers and/or sizes of trenches in trench arrays formed on different conductive layers are the same.

Optionally, in the n conductive layers, trench arrays formed on different conductive layers overlap completely in the vertical direction.

That is, the same etching parameters may be adopted so that numbers and/or sizes of trenches in trench arrays formed on different conductive layers are the same.

Certainly, in the n conductive layers, numbers and/or sizes of trenches in trench arrays formed on different conductive layers may be different. For example, a number and/or sizes of trenches in a trench array formed on an odd-numbered conductive layer is different from a number and/or sizes of trenches in a trench array formed on an even-numbered conductive layer, which is not limited in the embodiment of the present disclosure.

Optionally, the second external electrode 140 is further electrically connected to the semiconductor substrate 110 through the second conductive via structure 162. That is, the semiconductor substrate 110 is conductive, or a region of the semiconductor substrate 110 in contact with the laminated structure 120 is conductive.

Optionally, the semiconductor substrate 110 is formed of a material with a resistivity less than a threshold value, or a surface of the semiconductor substrate 110 is provided with a heavily doped conductive layer or conductive region with a resistivity less than a threshold value.

It should be noted that, in a case that the second external electrode 140 is electrically connected to the semiconductor substrate 110 through the second conductive via structure 162, the second conductive via structure 162 extends into the semiconductor substrate 110 after penetrating an isolation trench in an odd-numbered conductive layer of the n conductive layers, and the second external electrode 140 is electrically connected to the semiconductor substrate 110 and all the even-numbered conductive layer(s) of the n conductive layers through the second conductive via structure 162. The first conductive via structure 161 extends into the first conductive layer in the laminated structure 120 after penetrating an isolation trench in an even-numbered conductive layer of the n conductive layers.

Optionally, in the embodiment of the present disclosure, the method 200 further includes:

producing an etching stop structure 150, where the etching stop structure 150 is provided on an upper surface of the semiconductor substrate 110 to prevent the first conductive via structure 161 from being electrically connected with the semiconductor substrate 110.

It should be noted that, in a case that the second external electrode 140 is electrically connected to the semiconductor substrate 110 through the second conductive via structure 162, the etching stop structure 150 may prevent the first conductive via structure 161 from extending into the semiconductor substrate 110. In particular, in a case that the first conductive via structure 161 and the second conductive via structure 162 are formed in the same etching step, the etching stop structure 150 could effectively prevent the first conductive via structure 161 from being electrically connected with the semiconductor substrate 110.

Optionally, a projection of the etching stop structure 150 on the semiconductor substrate 110 is larger than or equal to the second overlap region to ensure that the etching stop structure 150 could prevent the first conductive via structure 161 from being electrically connected with the semiconductor substrate 110.

Optionally, the method 200 further includes:

producing at least one substrate trench 30 on the semiconductor substrate 110, where the at least one substrate trench 30 enters the semiconductor substrate 110 downward from an upper surface of the semiconductor substrate 110, and the first conductive layer of the n conductive layers is provided in the at least one substrate trench.

It should be noted that, in a case that the second external electrode 140 is electrically connected to the semiconductor substrate 110 through the second conductive via structure 162, the first conductive via structure 161 extends into the at least one substrate trench 30, and thus the at least one substrate trench 30 may prevent the first conductive via structure 161 from extending into the semiconductor substrate 110. In particular, in a case that the first conductive via structure 161 and the second conductive via structure 162 are formed in the same etching step, the at least one substrate trench 30 could effectively prevent the first conductive via structure 161 from being electrically connected with the semiconductor substrate 110.

Optionally, a number of trenches of the at least one substrate trench 30 is the same as a number of isolation trenches provided in an even-numbered conductive layer of the n conductive layers; and/or a size of a trench of the at least one substrate trench 30 is the same as a size of an isolation trench provided in an even-numbered conductive layer of the n conductive layers.

Optionally, a projection of the at least one substrate trench 30 on the semiconductor substrate 110 is larger than or equal to the second overlap region.

Optionally, the method 200 further includes:

producing a substrate trench array 40 provided around the at least one substrate trench 30 on the semiconductor substrate 110, where the substrate trench array 40 enters the semiconductor substrate 110 downward from the upper surface of the semiconductor substrate 110, and the first conductive layer of the n conductive layers is provided in the substrate trench array 40.

Optionally, a size of a trench in the substrate trench array 40 is smaller than a size of a trench of the at least one substrate trench 30, and/or a depth of a trench in the substrate trench array 40 is less than a depth of a trench of the at least one substrate trench 30.

Optionally, the foregoing step 220 may specifically be: producing an electrode layer above the laminated structure 120, where the electrode layer includes at least one first conductive region and at least one second conductive region separated from each other, the first conductive region forms the first external electrode 130, and the second conductive region forms the second external electrode 140.

Optionally, the method 200 further includes:

producing an interconnection structure 160, where the interconnection structure 160 includes at least one insulating layer 163, the first conductive via structure 161 and the second conductive via structure 162, the at least one insulating layer 163 is provided above the laminated structure 120, and the first conductive via structure 161 and the second conductive via structure 162 penetrate the at least one insulating layer 163.

Figure 9A:
FIG. 9a to FIG. 9n are schematic diagrams of a manufacturing method for a capacitor according to an embodiment of the present disclosure.

Optionally, in one embodiment of the present disclosure, it is assumed that m=5, and n=5, that is, the laminated structure 120 includes: the first conductive layer 1201, the second conductive layer 1202, the third conductive layer 1203, the fourth conductive layer 1204 and the fifth conductive layer 1205; and the first dielectric layer 1211, the second dielectric layer 1212, the third dielectric layer 1213, the fourth dielectric layer 1214 and the fifth dielectric layer 1215. In this embodiment, the foregoing step 210 and step 220 may specifically be producing flows as shown in step 1*a* to step 1*n* (FIG. 9*a* to FIG. 9*n*) to produce the capacitor 100 as shown in FIG. 5. Certainly, the capacitors 100 as shown in FIG. 1 and FIG. 4 may also be produced, and reference may be made to the producing flows of a capacitor as shown in step 1a to step 1n (FIG. 9a to FIG. 9n). No further details are repeated redundantly herein for brevity.

Step 1a, a heavily doped monocrystalline silicon wafer is selected as a semiconductor substrate 110, as shown in FIG. 9a, that is, the semiconductor substrate 110 is conductive.

Figure 9B:

Step 1b, an etching stop layer is deposited on an upper surface of the semiconductor substrate 110 as shown in FIG. 9a, and photolithography processing is performed to form an etching stop structure 150, as shown in FIG. 9b.

Figure 9C:
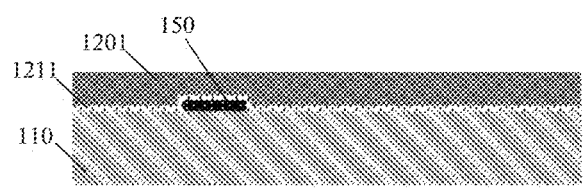

Step 1c, the first dielectric layer 1211 is deposited on the upper surface of the semiconductor substrate 110 and an upper surface of the etching stop structure 150, and the first conductive layer 1201 is deposited on an upper surface of the first dielectric layer 1211, as shown in FIG. 9c.

Figure 9D:
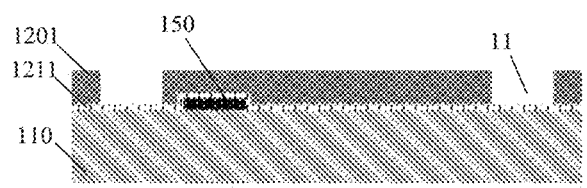

Step 1d, a mask layer of a pattern A is formed on an upper surface of the first conductive layer 1201 using graphic techniques such as photolithography, nanoimprinting, or laser direct writing, a first isolation trench 11 is then produced on the first conductive layer 1201 using an etching process, the first isolation trench 11 divides the first conductive layer 1201 into two conductive regions electrically isolated from each other, as shown in FIG. 9d, and a top view of the first isolation trench 11 may be as shown in FIG. 2.

Figure 9E:
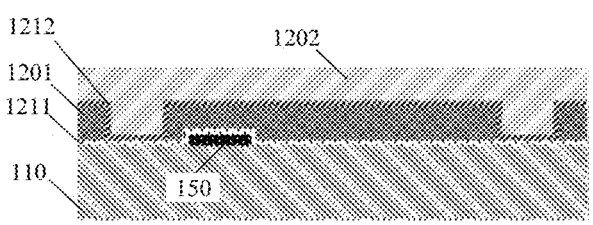

Step 1e, first, the second dielectric layer 1212 is deposited on the upper surface of the first conductive layer 1201 and side walls and a bottom of the first isolation trench 11, the second dielectric layer 1212 and the first conductive layer 1201 are conformal, then, the second conductive layer 1202 is deposited on an upper surface and an inner surface of the second dielectric layer 1212, and the second conductive layer 1202 fills the first isolation trench 11, as shown in FIG. 9e.

Figure 9F:
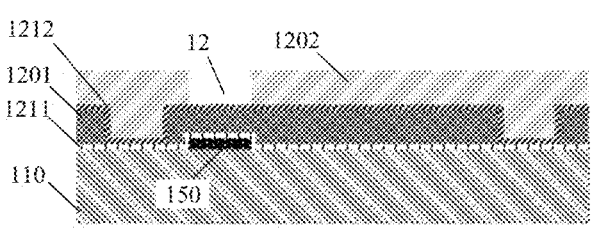

Step 1f, a mask layer of a pattern B is formed on an upper surface of the second conductive layer 1202 using graphic techniques such as photolithography, nanoimprinting, or laser direct writing, a second isolation trench 12 is then produced on the second conductive layer 1202 using the etching process, and the second isolation trench 12 divides the second conductive layer 1202 into two conductive regions electrically isolated from each other, as shown in FIG. 9f.

Figure 9G:
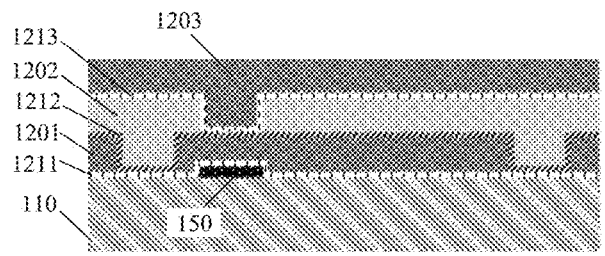

Step 1g, first, the third dielectric layer 1213 is deposited on the upper surface of the second conductive layer 1202 and side walls and a bottom of the second isolation trench 12, the third dielectric layer 1213 and the second conductive layer 1202 are conformal, then, the third conductive layer 1203 is deposited on an upper surface and an inner surface of the third dielectric layer 1213, and the third conductive layer 1203 fills the second isolation trench 12, as shown in FIG. 9g.

Figure 9H:
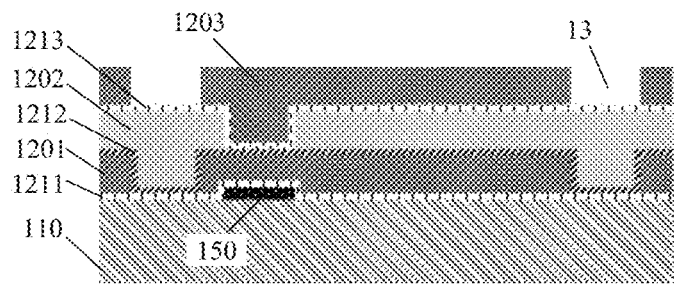

Step 1h, a mask layer of the pattern A is formed on an upper surface of the third conductive layer 1203 using graphic techniques such as photolithography, nanoimprinting, or laser direct writing, a third isolation trench 13 is then produced on the third conductive layer 1203 using the etching process, and the third isolation trench 13 divides the third conductive layer 1203 into two conductive regions electrically isolated from each other, as shown in FIG. 9h.

Figure 9I:
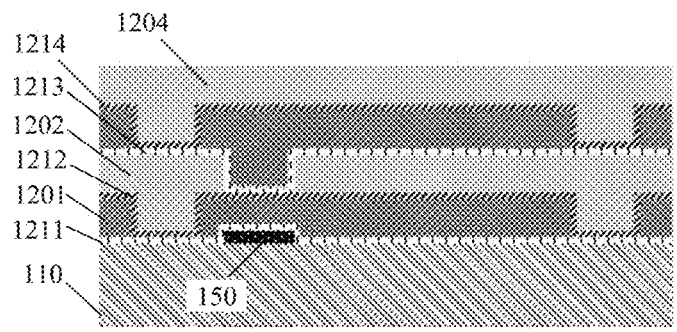

Step 1i, first, the fourth dielectric layer 1214 is deposited on the upper surface of the third conductive layer 1203 and side walls and a bottom of the third isolation trench 13, the fourth dielectric layer 1214 and the third conductive layer 1203 are conformal, then, the fourth conductive layer 1204 is deposited on an upper surface and an inner surface of the fourth dielectric layer 1214, and the fourth conductive layer 1204 fills the third isolation trench 13, as shown in FIG. 9i.

Figure 9J:
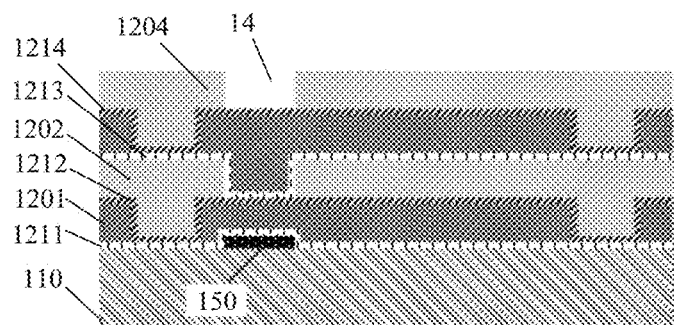

Step 1j, a mask layer of the pattern B is formed on an upper surface of the fourth conductive layer 1204 using graphic techniques such as photolithography, nanoimprinting, or laser direct writing, a fourth isolation trench 14 is then produced on the fourth conductive layer 1204 using the etching process, and the fourth isolation trench 14 divides the fourth conductive layer 1204 into two conductive regions electrically isolated from each other, as shown in FIG. 9j.

Figure 9K:
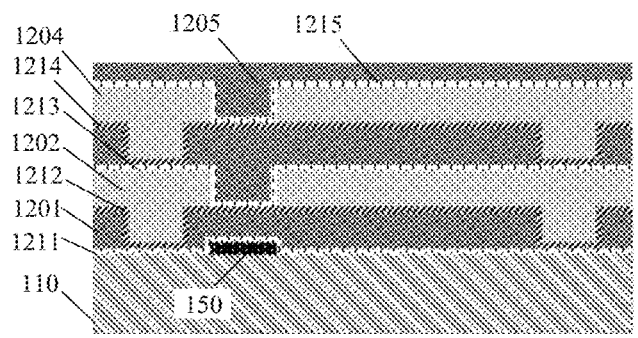

Step 1k, first, the fifth dielectric layer 1215 is deposited on the upper surface of the fourth conductive layer 1204 and side walls and a bottom of the fourth isolation trench 14, the fifth dielectric layer 1215 and the fourth conductive layer 1204 are conformal, then, the fifth conductive layer 1205 is deposited on an upper surface and an inner surface of the fifth dielectric layer 1215, and the fifth conductive layer 1205 fills the fourth isolation trench 14, as shown in FIG. 9k.

Figure 9L:
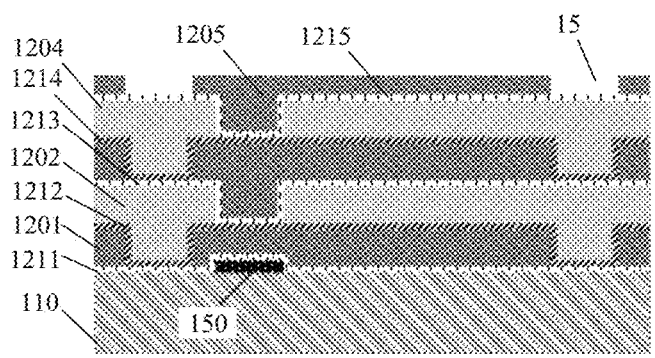

Step 1l, a mask layer of the pattern A is formed on an upper surface of the fifth conductive layer 1205 using graphic techniques such as photolithography, nanoimprinting, or laser direct writing, a fifth isolation trench 15 is then produced on the fifth conductive layer 1205 using the etching process, and the fifth isolation trench 15 divides the fifth conductive layer 1205 into two conductive regions electrically isolated from each other, as shown in FIG. 9l.

Figure 9M:
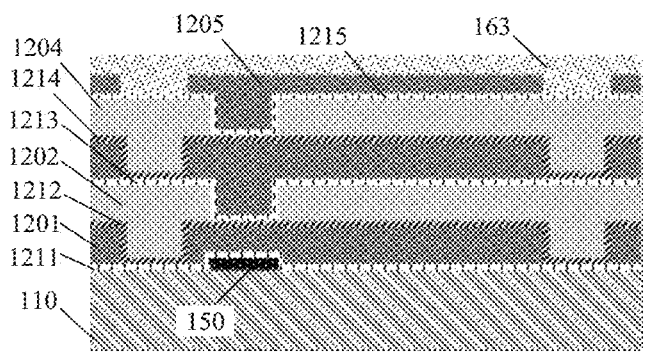
Figure 9N:
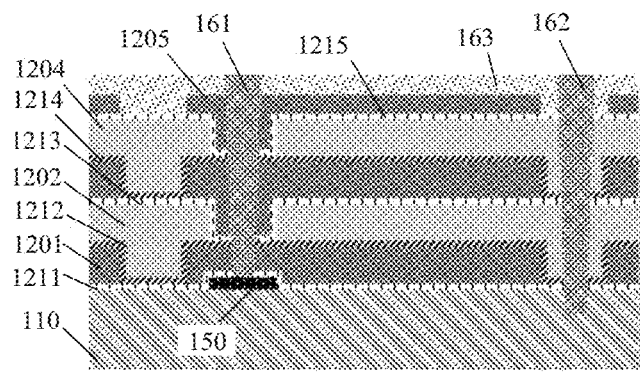

Step 1m, an insulating layer 163 is deposited on the upper surface of the fifth conductive layer 1205 and in the fifth isolation trench 15, as shown in FIG. 9m; a first conductive via structure 161 and a second conductive via structure 162 are produced using the etching process and a deposition process; the first conductive via structure 161 penetrates the second isolation trench 12 and the fourth isolation trench 14, and extends to the upper surface of the etching stop structure 150; the second conductive via structure 162 penetrates the first isolation trench 11, the third isolation trench 13 and the fifth isolation trench 15, and extends into the semiconductor substrate 110; and thus an interconnection structure 160 is produced, as shown in FIG. 9n.

Step 1n, a first external electrode 130 and a second external electrode 140 are produced above the interconnection structure 160, where the first external electrode 130 is electrically connected to all odd-numbered conductive layer(s) of n conductive layers through the first conductive via structure 161, and the second external electrode 140 is electrically connected to the semiconductor substrate 110 and all even-numbered conductive layer(s) of the n conductive layers through the second conductive via structure 162, as shown in FIG. 5.

Optionally, in one embodiment of the present disclosure, it is assumed that m=4, and n=4, that is, the laminated structure 120 includes: the first conductive layer 1201, the second conductive layer 1202, the third conductive layer 1203 and the fourth conductive layer 1204; and the first dielectric layer 1211, the second dielectric layer 1212, the third dielectric layer 1213 and the fourth dielectric layer 1214. In this embodiment, the foregoing step 210 and step 220 may specifically be producing flows as shown in step 2a to step 21 (FIG. 10a to FIG. 10l) to produce the capacitor 100 as shown in FIG. 7. Certainly, the capacitors 100 as shown in FIG. 3 and FIG. 6 may also be produced, and reference may be made to the producing flows of a capacitor as shown in step 2a to step 21 (FIG. 10a to FIG. 10l). No further details are repeated redundantly herein for brevity.

Figure 10A:
FIG. 10a to FIG. 10l are schematic diagrams of a manufacturing method for a capacitor according to an embodiment of the present disclosure.

Step 2a, a high-resistance silicon wafer is selected as a semiconductor substrate 110, as shown in FIG. 10a.

Figure 10B:
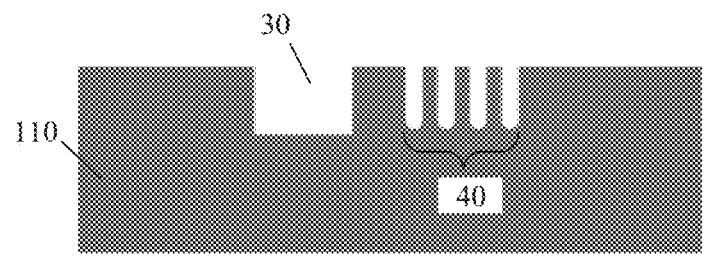

Step 2b, a layer of photoresist is spin-coated on an upper surface of the semiconductor substrate 110 as shown in FIG. 10a, after exposure and development, a substrate trench 30 and a substrate trench array 40 are manufactured using dry etching, and a heavily doped conductive region is formed on inner walls of the substrate trench 30, inner walls of the substrate trench array 40 and the upper surface of the semiconductor substrate 110 using a high-temperature diffusion process, as shown in FIG. 10b.

Figure 10C:
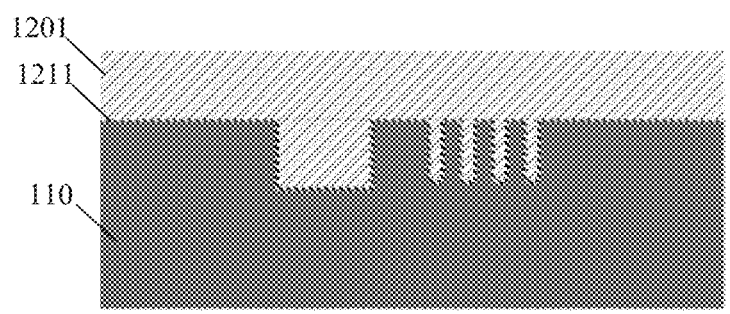

Step 2c, the first dielectric layer 1211 is deposited on the upper surface of the semiconductor substrate 110 and in the substrate trench 30 and the substrate trench array 40, the first conductive layer 1201 is deposited on an upper surface of the first dielectric layer 1211, the first dielectric layer 1211 and the semiconductor substrate 110 are conformal, and the first conductive layer 1201 fills the substrate trench 30 and the substrate trench array 40, as shown in FIG. 10c.

Figure 10D:
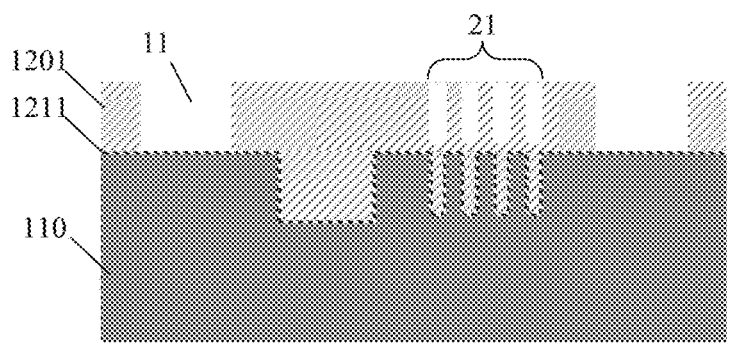

Step 2d, a mask layer of a pattern A is formed on an upper surface of the first conductive layer 1201 using graphic techniques such as photolithography, nanoimprinting, or laser direct writing, a first isolation trench 11 and a first trench array 21 are then produced on the first conductive layer 1201 using an etching process, the first isolation trench 11 divides the first conductive layer 1201 into two conductive regions electrically isolated from each other, a size of a trench in the first trench array 21 is smaller than a size of the first isolation trench 11, a depth of a trench in the first trench array 21 is less than a depth of the first isolation trench 11, as shown in FIG. 10d, and a top view of the first isolation trench 11 may be as shown in FIG. 2.

Figure 10E:
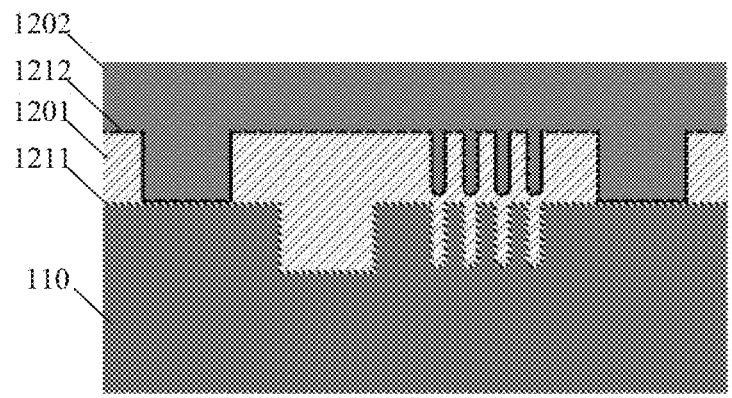

Step 2e, first, the second dielectric layer 1212 is deposited on the upper surface of the first conductive layer 1201, side walls and a bottom of the first isolation trench 11 and side walls and bottoms of the first trench array 21, the second dielectric layer 1212 and the first conductive layer 1201 are conformal, then, the second conductive layer 1202 is deposited on an upper surface and an inner surface of the second dielectric layer 1212, and the second conductive layer 1202 fills the first isolation trench 11 and the first trench array 21, as shown in FIG. 10e.

Figure 10F:
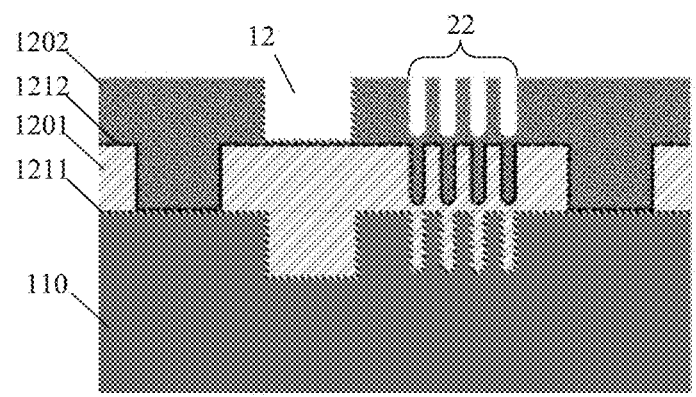

Step 2f, a mask layer of a pattern B is formed on an upper surface of the second conductive layer 1202 using graphic techniques such as photolithography, nanoimprinting, or laser direct writing, a second isolation trench 12 and a second trench array 22 are then produced on the second conductive layer 1202 using the etching process, the second isolation trench 12 divides the second conductive layer 1202 into two conductive regions electrically isolated from each other, a size of a trench in the second trench array 22 is smaller than a size of the second isolation trench 12, and a depth of a trench in the second trench array 22 is less than a depth of the second isolation trench 12, as shown in FIG. 10f.

Figure 10G:
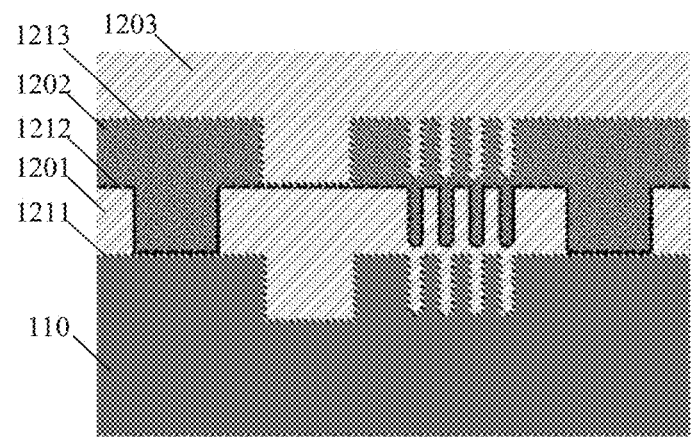

Step 2g, first, the third dielectric layer 1213 is deposited on the upper surface of the second conductive layer 1202, side walls and a bottom of the second isolation trench 12 and side walls and bottoms of the second trench array 22, the third dielectric layer 1213 and the second conductive layer 1202 are conformal, then, the third conductive layer 1203 is deposited on an upper surface and an inner surface of the third dielectric layer 1213, and the third conductive layer 1203 fills the second isolation trench 12 and the second trench array 22, as shown in FIG. 10g.

Figure 10H:
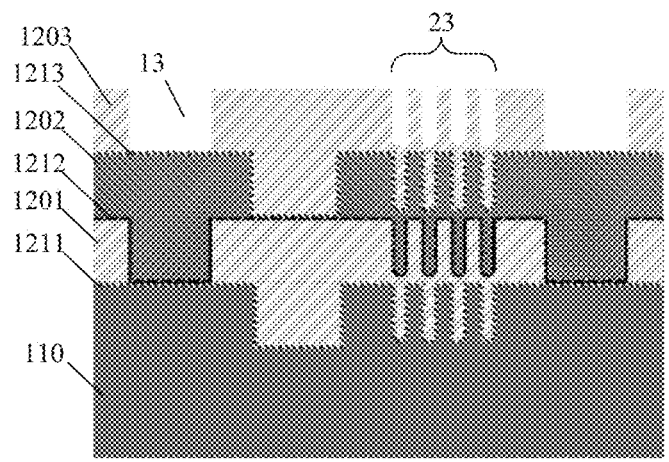

Step 2h, a mask layer of the pattern A is formed on an upper surface of the third conductive layer 1203 using graphic techniques such as photolithography, nanoimprinting, or laser direct writing, a third isolation trench 13 and a third trench array 23 are then produced on the third conductive layer 1203 using the etching process, the third isolation trench 13 divides the third conductive layer 1203 into two conductive regions electrically isolated from each other, a size of a trench in the third trench array 23 is smaller than a size of the third isolation trench 13, and a depth of a trench in the third trench array 23 is less than a depth of the third isolation trench 13, as shown in FIG. 10h.

Figure 10I:
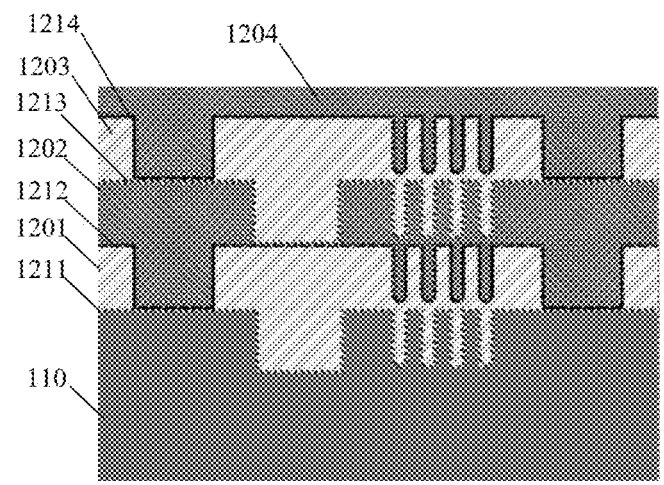

Step 2i, first, the fourth dielectric layer 1214 is deposited on the upper surface of the third conductive layer 1203, side walls and a bottom of the third isolation trench 13 and side walls and bottoms of the third trench array 23, the fourth dielectric layer 1214 and the third conductive layer 1203 are conformal, then, the fourth conductive layer 1204 is deposited on an upper surface and an inner surface of the fourth conductive layer 1214, and the fourth conductive layer 1204 fills the third isolation trench 13 and the third trench array 23, as shown in FIG. 10i.

Figure 10J:
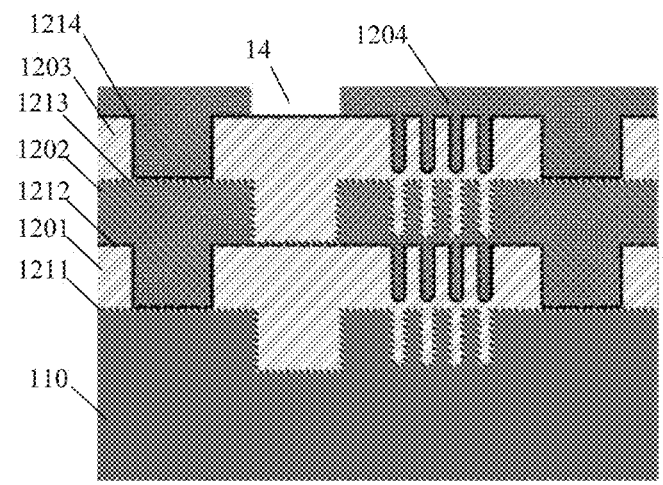

Step 1j, a mask layer of a pattern C is formed on an upper surface of the fourth conductive layer 1204 using graphic techniques such as photolithography, nanoimprinting, or laser direct writing, the pattern C lacks only a pattern related to a trench array compared with the pattern B, a fourth isolation trench 14 is then produced on the fourth conductive layer 1204 using the etching process, and the fourth isolation trench 14 divides the fourth conductive layer 1204 into two conductive regions electrically isolated from each other, as shown in FIG. 10j.

Figure 10K:
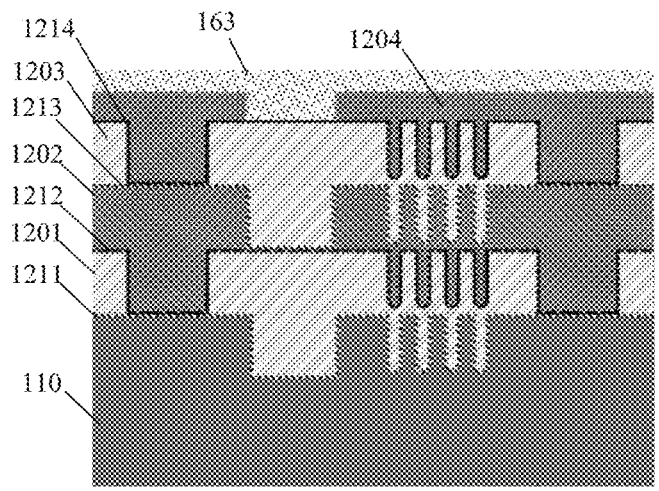
Figure 10L:
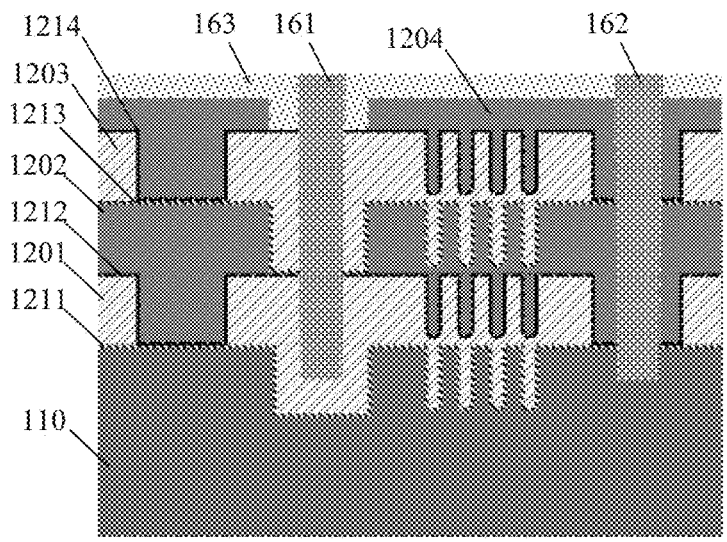

Step 2k, an insulating layer 163 is deposited on the upper surface of the fourth conductive layer 1204 and in the fourth isolation trench 14, as shown in FIG. 10k; a first conductive via structure 161 and a second conductive via structure 162 are produced using the etching process and a deposition process; the first conductive via structure 161 penetrates the second isolation trench 12 and the fourth isolation trench 14, and extends into the substrate trench 30; the second conductive via structure 162 penetrates the first isolation trench 11 and the third isolation trench 13, and extends into the heavily doped conductive region formed on the semiconductor substrate 110 by diffusion; and thus an interconnection structure 160 is produced, as shown in FIG. 10l.

Step 2l, a first external electrode 130 and a second external electrode 140 are produced above the interconnection structure 160, where the first external electrode 130 is electrically connected to all odd-numbered conductive layer(s) of n conductive layers through the first conductive via structure 161, and the second external electrode 140 is electrically connected to the semiconductor substrate 110 and all even-numbered conductive layer(s) of the n conductive layers through the second conductive via structure 162, as shown in FIG. 7.

Therefore, in the manufacturing method for a capacitor provided in the embodiment of the present disclosure, a trench capacitor is produced in conductive layers in a laminated structure, and photolithography and thin film deposition steps with a plurality of consistent parameters are repeatedly used, which reduces alignment accuracy requirements of a plurality of conductive layers in the laminated structure, and could increase a number of stacked capacitor layers while maintaining low processing costs, and further increase a capacitance density of the capacitor.

Further, in the embodiment of the present disclosure, there is no need of multiple times of photolithography to form a step structure for electrical connection of an interconnection structure, which could reduce the number of photolithography required for producing the capacitor, reduce the process difficulty, and reduce manufacturing costs of the capacitor.

The manufacturing method for a capacitor according to the present disclosure will be further described below with reference to two specific embodiments. For ease of understanding, the capacitor as shown in FIG. 5 is manufactured in embodiment one. Certainly, the capacitors as shown in FIG. 1 and FIG. 4 may also be manufactured using a manufacturing method for a capacitor in embodiment one, but there is slightly different in parts, such as a setting of a laminated structure or a semiconductor substrate. No further details are repeated redundantly herein for brevity. The capacitor as shown in FIG. 7 is manufactured in embodiment two. Certainly, the capacitors as shown in FIG. 3 and FIG. 6 may also be manufactured using a manufacturing method for a capacitor in embodiment two, but there is slightly different in parts, such as a setting of a laminated structure or a semiconductor substrate. No further details are repeated redundantly herein for brevity Embodiment One Step one: a heavily doped monocrystalline silicon wafer is selected as a substrate.

Step two: a layer of silicon carbide (SiC) is deposited on a surface of the substrate as an etching stop layer, and photolithography processing is performed to form an etching stop structure.

Step three: first, using a low pressure chemical vapor deposition (LPCVD) process, a layer of silicon oxynitride (SiON) is deposited on the surface of the substrate as a first dielectric layer. Next, using the LPCVD process, a layer of heavily doped polysilicon is deposited as a first conductive layer.

Step four: a layer of photoresist is spin-coated on a surface of the first conductive layer, and after exposure and development, a first isolation trench is manufactured using dry etching. The first isolation trench divides the first conductive layer into two regions electrically isolated.

Step five: a layer of SiON is deposited on the surface of the first conductive layer and side walls and a bottom of the first isolation trench as a second dielectric layer. Next, using the LPCVD process, a layer of heavily doped polysilicon is deposited as a second conductive layer, and the second conductive layer fills the first isolation trench.

Step six: a layer of photoresist is spin-coated on a surface of the second conductive layer, and after exposure and development, a second isolation trench is manufactured using the dry etching. The second isolation trench is aligned with the etching stop structure formed in step two.

Step seven: step three to step six are repeated several times.

Step eight: using a plasma enhanced chemical vapor deposition (PECVD) process, a layer of silicon oxide is deposited on a surface of an n conductive layer as an intermetal dielectric layer.

Step nine: a layer of photoresist is spin-coated on a surface of the intermetal dielectric layer, and after exposure and development, two conductive vias are manufactured using the dry etching. One of the conductive vias penetrates odd-numbered isolation trenches, and its depth reaches the substrate; and the other conductive via penetrates even-numbered isolation trenches to stay on the etching stop structure.

Step ten: first, using a metal-organic chemical vapor deposition (MOCVD) process, the conductive vias are filled with a metal of tungsten to form vertical conductive channels. Next, excess tungsten on the surface is removed using a chemical mechanical polish (CMP) process. Then, a layer of Ti/TiN and a layer of Al are deposited by physical vapor deposition (PVD), and finally, two electrodes are formed by photolithography.

Embodiment Two

Step one: a high-resistance silicon wafer is selected as a substrate.

Step two: a layer of photoresist is spin-coated on a surface of the wafer, and after exposure and development, a substrate trench and a substrate trench array are manufactured using dry etching. Since a size of an opening of the substrate trench is larger than a size of an opening of the substrate trench array, when trenches with two sizes are formed simultaneously by the dry etching, a depth of the substrate trench is deeper than that of the substrate trench array. After the trenches are manufactured, boro-silicate glass (BSG) is deposited in the trenches, and a heavily doped conductive zone is formed on inner walls of the substrate trench and the substrate trench array and the surface of the substrate using a high-temperature diffusion process. Finally, the BGS is removed.

Step three: first, using an atomic layer deposition (ALD) process, a layer of $Al_2O_3$ is deposited as a first dielectric layer, and next, using an LPCVD process, a thick layer of heavily doped polysilicon is deposited to fill the substrate trench and the substrate trench array as a first conductive layer.

Step four: a layer of photoresist is spin-coated on a surface of the first conductive layer, and after exposure and development, a first isolation trench and a first trench array are manufactured using the dry etching. A depth of the first isolation trench reaches the first dielectric layer, and the first isolation trench divides the first conductive layer into two regions electrically isolated; and the first trench array is located inside the first conductive layer.

Step five: first, using the ALD process, a layer of $Al_2O_3$ is deposited as a second dielectric layer, and next, using the LPCVD process, a thick layer of heavily doped polysilicon is deposited to fill the first isolation trench and the first trench array as a second conductive layer.

Step six: a layer of photoresist is spin-coated on a surface of the second conductive layer, and after exposure and development, a second isolation trench and a second trench array are manufactured using the dry etching. A depth of the second isolation trench reaches the second dielectric layer; and the second trench array is located inside the second conductive layer.

Step seven: step three to step six are repeated, and a third dielectric layer, a third conductive layer, a third isolation trench and a third trench array are sequentially manufactured.

Step eight: first, using the ALD process, a layer of $Al_2O_3$ is deposited as a fourth dielectric layer, and next, using the LPCVD process, a thick layer of heavily doped polysilicon is deposited to fill the third isolation trench and the third trench array as a fourth conductive layer.

Step nine: using photolithography and etching processes, a fourth isolation trench is formed on the fourth conductive layer, and a depth of the trench reaches the fourth dielectric layer.

Step ten: using a PECVD process, a layer of silicon oxide is deposited on a surface of the fourth conductive layer as an intermetal dielectric layer.

Step eleven: a layer of photoresist is spin-coated on a surface of the intermetal dielectric layer, and after exposure and development, two conductive vias are manufactured using the dry etching. One of the conductive vias vertically penetrates odd-numbered isolation trenches, and its depth reaches the substrate trench filled with the first conductive layer; and the other conductive via penetrates even-numbered isolation trenches, and its depth reaches the heavily doped conductive zone formed on the substrate by diffusion.

Step twelve: first, using an MOCVD process, the conductive vias are filled with a metal of tungsten to form vertical conductive channels. Next, excess tungsten on the surface is removed using a CMP process. Then, a layer of Ti/TiN and a layer of Al are deposited by PVD, and finally, two electrodes are formed by photolithography.

A person skilled in the art can understand that preferred embodiments of the present disclosure are described in detail above with reference to the accompanying drawings. However, the present disclosure is not limited to specific details in the foregoing embodiments. Within the technical concept of the present disclosure, a variety of simple variants may be made to the technical solutions of the present disclosure, and these simple variants are within the protection scope of the present disclosure.

In addition, it should be noted that various specific technical features described in the foregoing specific embodiments may be combined in any suitable manner under the condition of no contradiction. In order to avoid unnecessary repetition, various possible combination ways will not be separately described in the present disclosure.

In addition, any combination may be made between various embodiments of the present disclosure without departing from the idea of the present disclosure, and it should also be regarded as the disclosure of the present disclosure.

What is claimed is:

1. A capacitor, wherein the capacitor comprises:
a semiconductor substrate;
a laminated structure provided above the semiconductor substrate and comprising n conductive layers and one or m dielectric layers, the n conductive layers and the one or m dielectric layers forming a structure that a conductive layer and a dielectric layer are adjacent to each other, the i-th conductive layer of the n conductive layers being provided with at least one i-th isolation trench, the at least one i-th isolation trench dividing the i-th conductive layer into at least two conductive regions electrically isolated from each other, the (i+1)-th conductive layer of the n conductive layers being provided above the i-th conductive layer and in the at least one i-th isolation trench, isolation trenches in odd-numbered conductive layers having a first overlap region in a vertical direction, isolation trenches in even-numbered conductive layers having a second overlap region in the vertical direction, and the first overlap region not overlapping the second overlap region, wherein m, n, and i are positive integers, $$\begin{cases} n > 2, \text{ and } 1 \le i \le n-1 \\ n = 2, \text{ and } i = 1 \end{cases};$$

at least one first external electrode, the first external electrode being electrically connected to each odd-numbered conductive layer of the n conductive layers through a first conductive via structure, and the first conductive via structure being provided in the second overlap region; and at least one second external electrode, the second external electrode being electrically connected to each even-numbered conductive layer of the n conductive layers through a second conductive via structure, and the second conductive via structure being provided in the first overlap region.

2. The capacitor according to claim 1, wherein the n-th conductive layer of the n conductive layers is provided with at least one n-th isolation trench, and the at least one n-th isolation trench divides the n-th conductive layer into at least two conductive regions electrically isolated from each other.

3. The capacitor according to claim 1, wherein
numbers and/or sizes of isolation trenches formed on different odd-numbered conductive layers of the n conductive layers are the same; and/or
numbers and/or sizes of isolation trenches formed on different even-numbered conductive layers of the n conductive layers are the same.

4. The capacitor according to claim 1, wherein
isolation trenches formed on different odd-numbered conductive layers of the n conductive layers overlap completely in the vertical direction; and/or
isolation trenches formed on different even-numbered conductive layers of the n conductive layers overlap completely in the vertical direction.

5. The capacitor according to claim 1, wherein the i-th conductive layer of the n conductive layers is provided with an i-th trench array around the at least one i-th isolation trench, and the (i+1)-th conductive layer of the n conductive layers is provided in the i-th trench array.

6. The capacitor according to claim 5, wherein a size of a trench in the i-th trench array is smaller than a size of the at least one i-th isolation trench, and/or a depth of a trench in the i-th trench array is less than a depth of the at least one i-th isolation trench.

7. The capacitor according to claim 5, wherein in the n conductive layers, numbers and/or sizes of trenches in trench arrays formed on different conductive layers are the same.

8. The capacitor according to claim 5, wherein in the n conductive layers, trench arrays formed on different conductive layers overlap completely in the vertical direction.

9. The capacitor according to claim 1, wherein the second external electrode is further electrically connected to the semiconductor substrate through the second conductive via structure.

10. The capacitor according to claim 9, wherein the semiconductor substrate is formed of a material with a resistivity less than a threshold value, or a surface of the semiconductor substrate is provided with a heavily doped conductive layer or conductive region with a resistivity less than a threshold value.

11. The capacitor according to claim 9, wherein the capacitor further comprises: an etching stop structure provided on an upper surface of the semiconductor substrate to prevent the first conductive via structure from being electrically connected with the semiconductor substrate.

12. The capacitor according to claim 11, wherein a projection of the etching stop structure on the semiconductor substrate is larger than or equal to the second overlap region.

13. The capacitor according to claim 1, wherein the semiconductor substrate comprises at least one substrate trench, the at least one substrate trench enters the semiconductor substrate downward from an upper surface of the semiconductor substrate, and a first conductive layer of the n conductive layers is provided in the at least one substrate trench.

14. The capacitor according to claim 13, wherein
a number of trenches of the at least one substrate trench is the same as a number of isolation trenches provided in an even-numbered conductive layer of the n conductive layers; and/or
a size of a trench of the at least one substrate trench is the same as a size of an isolation trench provided in an even-numbered conductive layer of the n conductive layers.

15. The capacitor according to claim 13, wherein a projection of the at least one substrate trench on the semiconductor substrate is larger than or equal to the second overlap region.

16. The capacitor according to claim 13, wherein the semiconductor substrate further comprises a substrate trench array provided around the at least one substrate trench, the substrate trench array enters the semiconductor substrate downward from the upper surface of the semiconductor substrate, and a first conductive layer of the n conductive layers is provided in the substrate trench array.

17. The capacitor according to claim 16, wherein a size of a trench in the substrate trench array is smaller than a size of a trench of the at least one substrate trench, and/or a depth of a trench in the substrate trench array is less than a depth of a trench of the at least one substrate trench.

18. The capacitor according to claim 1, wherein the capacitor further comprises: an interconnection structure comprising at least one insulating layer, the first conductive via structure and the second conductive via structure, the at least one insulating layer is provided above the laminated structure, and the first conductive via structure and the second conductive via structure penetrate the at least one insulating layer.

19. The capacitor according to claim 1, wherein the conductive layer comprises at least one of:
a heavily doped polysilicon layer, a carbon layer, an aluminum layer, a copper layer, a tungsten layer, a titanium layer, a tantalum layer, a platinum layer, a nickel layer, a ruthenium layer, an iridium layer, a rhodium layer, a tantalum nitride layer, a titanium nitride layer, a titanium aluminum nitride layer, a tantalum silicon nitride layer, or a tantalum carbon nitride layer; and the dielectric layer comprises at least one of:
a silicon oxide layer, a silicon nitride layer, a silicon oxynitride layer, a metal oxide layer, a metal nitride layer, or a metal oxynitride layer.

20. A manufacturing method for a capacitor, comprising:
producing a laminated structure above a semiconductor substrate, wherein the laminated structure comprises n conductive layers and m dielectric layer(s), the n conductive layers and the m dielectric layer(s) form a structure that a conductive layer and a dielectric layer are adjacent to each other, the i-th conductive layer of the n conductive layers is provided with at least one i-th isolation trench, the at least one i-th isolation trench divides the i-th conductive layer into at least two conductive regions electrically isolated from each other, the (i+1)-th conductive layer of the n conductive layers is provided above the i-th conductive layer and in the at least one i-th isolation trench, isolation trenches in odd-numbered conductive layers have a first overlap region in a vertical direction, isolation trenches in even-numbered conductive layers have a second overlap region in the vertical direction, and the first overlap region does not overlap the second overlap region, wherein m, n, and i are positive integers, $$\begin{cases} n > 2, \text{ and } 1 \leq i \leq n-1 \\ n = 2, \text{ and } i = 1 \end{cases};$$

and
producing at least one first external electrode and at least one second external electrode, wherein the first external electrode is electrically connected to all odd-numbered conductive layer(s) of the n conductive layers through a first conductive via structure, the second external electrode is electrically connected to all even-numbered conductive layer(s) of the n conductive layers through a second conductive via structure, the first conductive via structure is provided in the second overlap region, and the second conductive via structure is provided in the first overlap region.

* * * * *